(12) United States Patent
Jung et al.

(10) Patent No.: US 12,501,599 B2
(45) Date of Patent: Dec. 16, 2025

(54) SEMICONDUCTOR DEVICE AND METHOD OF FABRICATING THE SAME

(71) Applicant: SAMSUNG ELECTRONICS CO., LTD., Suwon-si (KR)

(72) Inventors: Haegeon Jung, Yongin-si (KR); Taeyong Kwon, Suwon-si (KR); Kwang-Yong Yang, Seoul (KR); Youngmook Oh, Hwaseong-si (KR); Bokyoung Lee, Hwaseong-si (KR); Seung Mo Ha, Seoul (KR); Hyunggoo Lee, Seoul (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 879 days.

(21) Appl. No.: 17/392,377

(22) Filed: Aug. 3, 2021

(65) Prior Publication Data
US 2022/0189970 A1    Jun. 16, 2022

(30) Foreign Application Priority Data
Dec. 11, 2020 (KR) ................. 10-2020-0173132

(51) Int. Cl.
| | |
|---|---|
| H10B 10/00 | (2023.01) |
| H10D 30/01 | (2025.01) |
| H10D 30/62 | (2025.01) |
| H10D 62/10 | (2025.01) |
| H10D 84/83 | (2025.01) |

(52) U.S. Cl.
CPC .......... *H10B 10/12* (2023.02); *H10D 30/024* (2025.01); *H10D 30/6211* (2025.01); *H10D 30/6219* (2025.01); *H10D 62/115* (2025.01); *H10D 84/834* (2025.01)

(58) Field of Classification Search
CPC .......... H01L 21/76229; H01L 27/0886; H01L 29/41791; H01L 29/66795
See application file for complete search history.

(56) References Cited

U.S. PATENT DOCUMENTS

| | | | |
|---|---|---|---|
| 9,012,287 B2 | 4/2015 | Liaw | |
| 9,437,713 B2 | 9/2016 | Singh et al. | |
| 9,991,267 B1* | 6/2018 | Anderson | ........... H01L 29/7827 |
| 10,050,046 B2 | 8/2018 | Huang et al. | |
| 10,096,521 B2 | 10/2018 | Weybright et al. | |
| 10,312,104 B2 | 6/2019 | Cheng | |
| 10,461,087 B2 | 10/2019 | Liaw | |
| 2013/0309838 A1* | 11/2013 | Wei | ................. H01L 21/76229 |
| | | | 257/E21.546 |

(Continued)

*Primary Examiner* — Chad M Dicke
*Assistant Examiner* — Valerie N Newton
(74) *Attorney, Agent, or Firm* — Muir Patent Law, PLLC

(57) ABSTRACT

A semiconductor device includes a substrate having a first memory cell and a second memory cell, the first and second memory cells being adjacent to each other in a first direction, first to fourth memory fins adjacent to each other in the first direction in the first memory cell, the first to fourth memory fins protruding from the substrate, fifth to eighth memory fins adjacent to each other in the first direction in the second memory cell, the fifth to eighth memory fins protruding from the substrate, and a first shallow device isolation layer between the fourth memory fin and the fifth memory fin, a sidewall of the first shallow device isolation layer having an inflection point.

18 Claims, 32 Drawing Sheets

(56) References Cited

U.S. PATENT DOCUMENTS

| | | | |
|---|---|---|---|
| 2014/0367798 A1* | 12/2014 | Kuo | H01L 21/76224 |
| | | | 257/401 |
| 2016/0099177 A1* | 4/2016 | Youn | H01L 29/66545 |
| | | | 438/283 |
| 2016/0300949 A1* | 10/2016 | Lee | H01L 29/66636 |
| 2020/0203215 A1* | 6/2020 | Jang | H10B 99/00 |

* cited by examiner

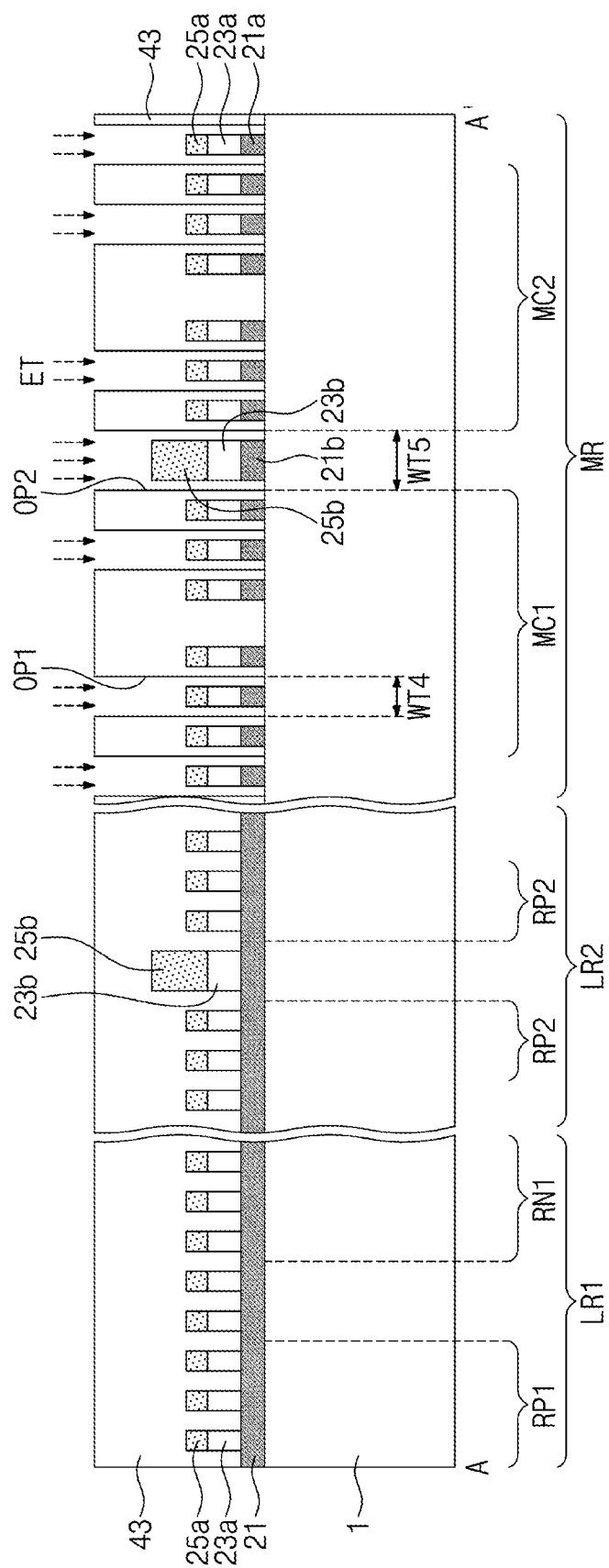

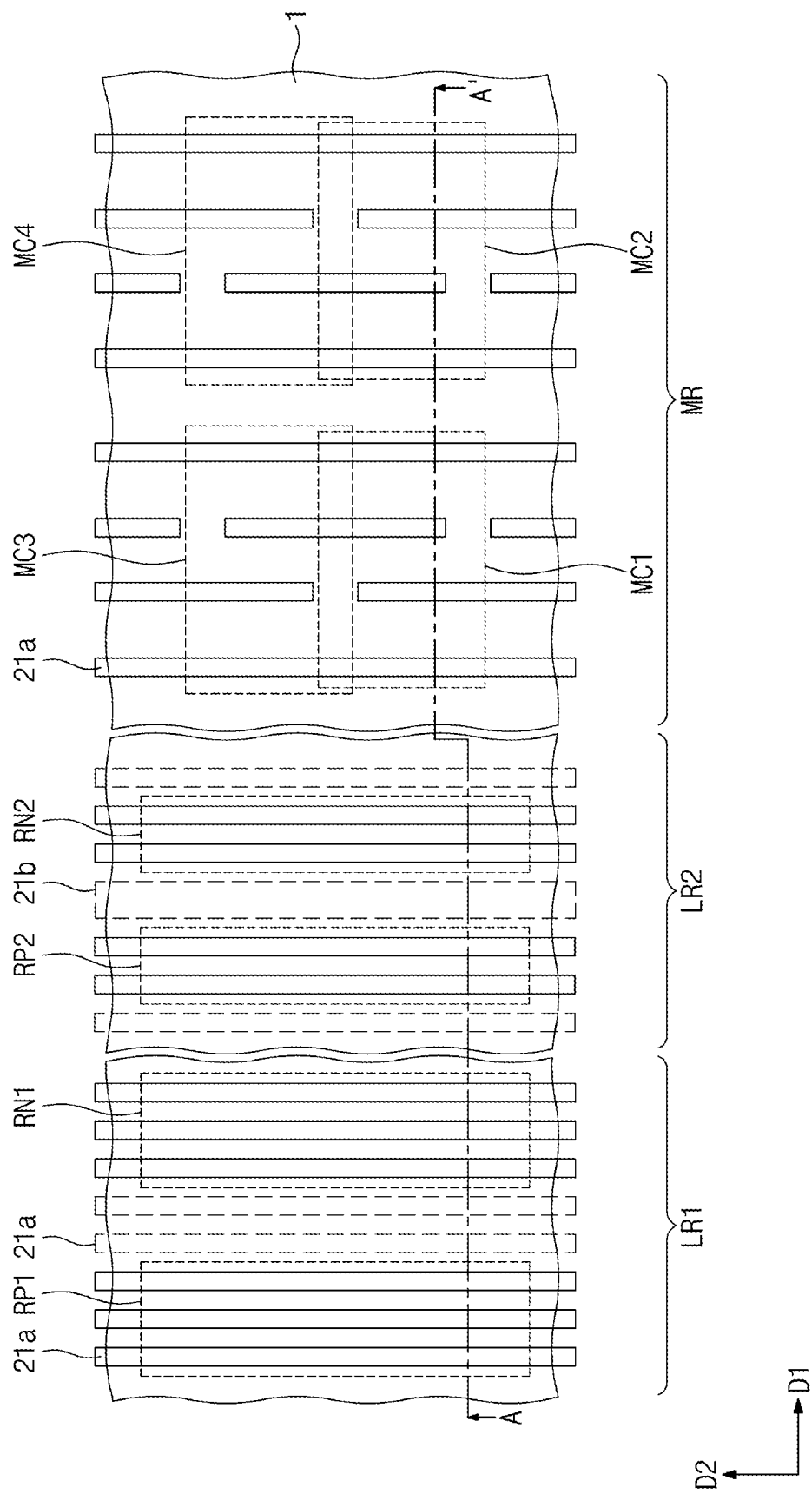

SEMICONDUCTOR DEVICE AND METHOD OF FABRICATING THE SAME

CROSS-REFERENCE TO RELATED APPLICATIONS

Korean Patent Application No. 10-2020-0173132, filed on Dec. 11, 2020, in the Korean Intellectual Property Office, and entitled: "Semiconductor Device and Method of Fabricating the Same," is incorporated by reference herein in its entirety.

BACKGROUND

1. Field

The present disclosure relates to a semiconductor device, and in particular, to a semiconductor device including fin field effect transistors.

2. Description of the Related Art

Due to their small-sized, multifunctionality, and/or low-cost characteristics, semiconductor devices are being esteemed as important elements in the electronic industry. The semiconductor devices may be classified into a semiconductor memory device for storing data, a semiconductor logic device for processing data, and a hybrid semiconductor device including both of memory and logic elements. As the electronic industry advances, there is an increasing demand for semiconductor devices with improved characteristics. For example, there is an increasing demand for semiconductor devices with high reliability, high performance, and/or multiple functions. To meet this demand, complexity and/or integration density of semiconductor devices are being increased.

SUMMARY

According to embodiments, a semiconductor device may include a substrate having a first memory cell and a second memory cell which are disposed side by side in a first direction, first to fourth memory fins which are sequentially arranged in the first direction in the first memory cell and protrude from the substrate, fifth to eighth memory fins which are sequentially arranged in the first direction in the second memory cell and protrude from the substrate, and a first shallow device isolation layer located between the fourth memory fin and the fifth memory fin. A sidewall of the first shallow device isolation layer may have an inflection point.

According to embodiments, a semiconductor device may include a substrate having a first memory cell and a second memory cell which are disposed side by side in a first direction, first to fourth memory fins which are sequentially arranged in the first direction in the first memory cell and protrude from the substrate, and fifth to eighth memory fins which are sequentially arranged in the first direction in the second memory cell and protrude from the substrate. A first distance between the first memory fin and the second memory fin may be larger than a second distance between the second memory fin and the third memory fin and may be smaller than a third distance between the fourth memory fin and the fifth memory fin.

According to embodiments, a semiconductor device may include a substrate having a first memory cell and a second memory cell which are disposed side by side in a first direction, first to fourth memory fins which are sequentially arranged in the first direction in the first memory cell and protrude from the substrate, fifth to eighth memory fins which are sequentially arranged in the first direction in the second memory cell and protrude from the substrate, a first gate electrode crossing the first to third memory fins, a second gate electrode crossing the fourth and fifth memory fins, and a third gate electrode crossing the sixth to eighth memory fins. A first distance between the first memory fin and the second memory fin may be larger than a second distance between the second memory fin and the third memory fin and may be smaller than a third distance between the fourth memory fin and the fifth memory fin.

According to embodiments, a method of fabricating a semiconductor device may include sequentially stacking a first mask layer and a second mask layer on a substrate including a first region and a second region, forming third mask patterns on the second mask layer, the third mask patterns including third normal mask patterns, a plurality of which are located on each of the first and second regions, and each of which has a first width and a first thickness, and a third merged mask pattern which is located on the substrate between the first and second regions and has a second width and a second thickness that are larger than the first width and the first thickness, respectively, etching the second mask layer using the third normal mask patterns and the third merged mask pattern as an etch mask, and removing the third normal mask patterns and the third merged mask pattern.

BRIEF DESCRIPTION OF THE DRAWINGS

Features will become apparent to those of skill in the art by describing in detail exemplary embodiments with reference to the attached drawings, in which:

FIGS. 8A to 8E are plan views of stages in a process of fabricating a semiconductor device having the planar structure of FIG. 1.

DETAILED DESCRIPTION

Figure 1:
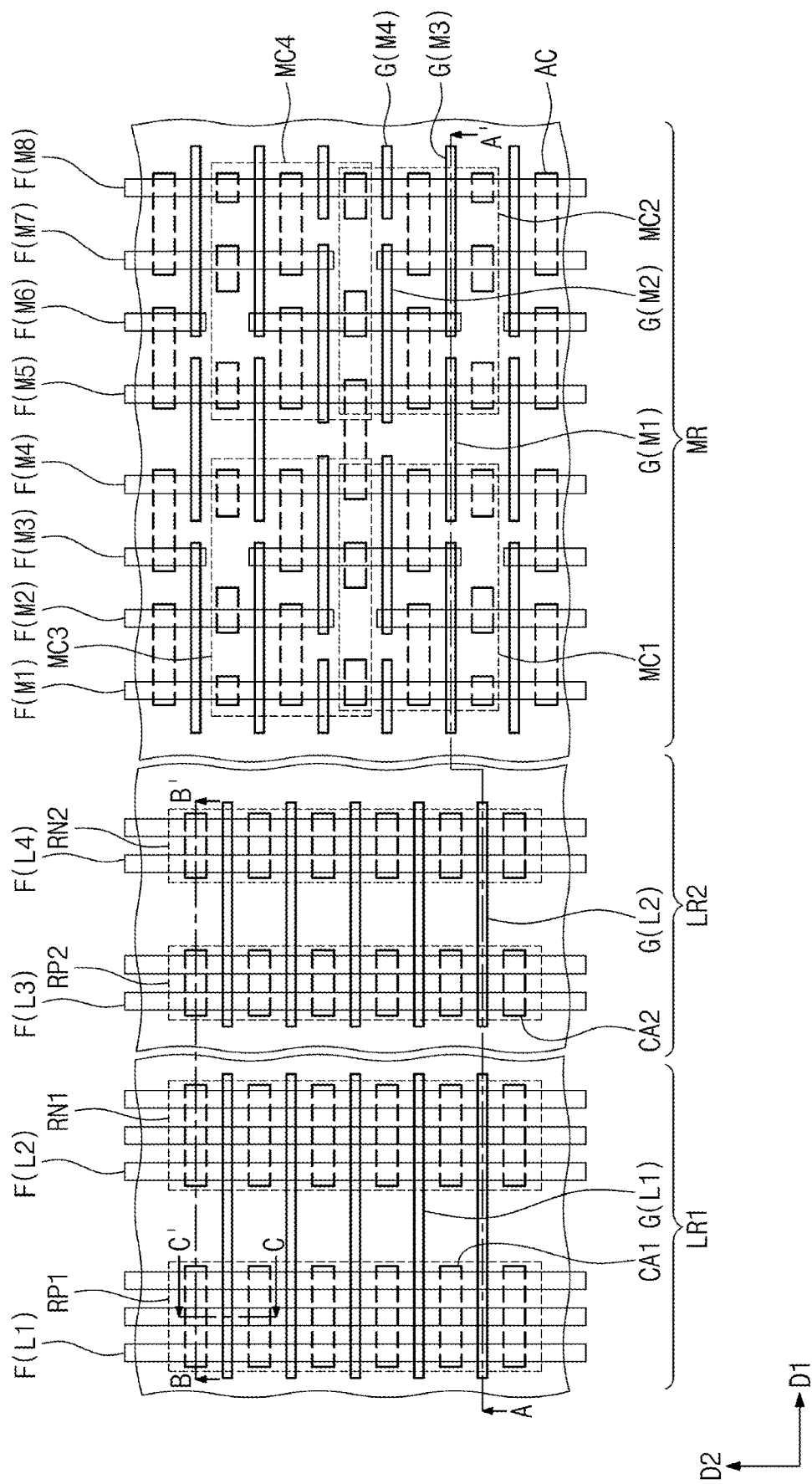
FIG. 1 is a plan view of a semiconductor device according to embodiments.
Figure 2:
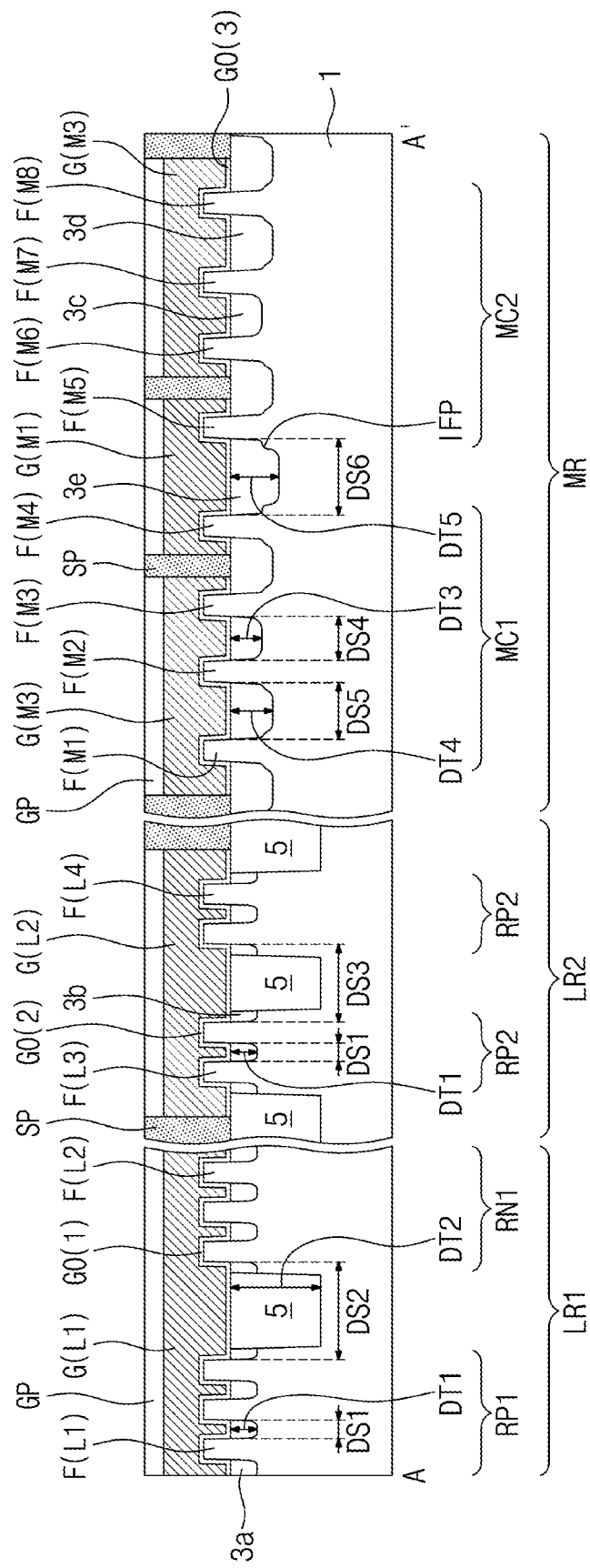
FIG. 2 is a cross-sectional view taken along line A-A' of FIG. 1.

FIG. 1 is a plan view of a semiconductor device according to embodiments. FIG. 2 is a cross-sectional view along line A-A' of FIG. 1.

Referring to FIGS. 1 and 2, a substrate 1 may be provided. In an embodiment, fin-shaped field effect transistors (FinFETs) may be disposed on the substrate 1. The substrate 1 may be, e.g., a single-crystalline silicon wafer or a silicon-on-insulator (SOI) wafer. A plurality of fins F may protrude from the substrate 1. The fins F may be bar-shaped or line-shaped patterns elongated in a second direction D2. Device isolation layers 3a-3e and 5 may be provided between the fins F. The device isolation layers 3a-3e and 5 may have top surfaces which are lower than top surfaces of the fins F, and thus, upper side surfaces of the fins F may be exposed. The device isolation layers 3a-3e and 5 may be formed of or include at least one of, e.g., silicon oxide, silicon nitride, or silicon oxynitride, and may have a single- or multi-layered structure. Gate electrodes G may be provided on the fins F to cross the fins F in a first direction D1. The gate electrode G may include a work function pattern and a metal line pattern.

The work function pattern may be an n-type work function pattern or a p-type work function pattern. The n-type work function pattern may be formed of or include at least one of, e.g., lanthanum (La), lanthanum oxide (LaO), tantalum (Ta), tantalum nitride (TaN), niobium (Nb), or titanium nitride (TiN). The p-type work function pattern may be formed of or include at least one o, e.g., aluminum (Al), aluminum oxide (AlOx), titanium nitride (TiN), tungsten nitride (WN), or ruthenium oxide (RuO$_2$). The metal line pattern may be formed of or include at least one of, e.g., tungsten, copper, or aluminum.

A gate insulating layer GO may be interposed between the fins F and the gate electrodes G. The gate insulating layer GO may include, e.g., a silicon oxide layer. In an embodiment, the gate insulating layer GO may further include a high-k dielectric layer whose dielectric constant is higher than a dielectric constant of the silicon oxide layer. The high-k dielectric layer may be formed of at least one of, e.g., hafnium oxide (HfO$_2$), hafnium silicate (HfSiO), hafnium oxynitride (HfON), hafnium silicon oxynitride (HfSiON), hafnium aluminum oxide (HfAlO$_3$), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), titanium oxide (TiO$_2$), barium strontium titanium oxide (BaSrTiO), barium titanium oxide (BaTiO), strontium titanium oxide (SrTiO), yttrium oxide (YO), aluminum oxide (Al$_2$O$_3$), tantalum oxide (Ta$_2$O$_3$), or lead scandium tantalum oxide (PbScTaO). A gate capping pattern GP may be provided on the gate electrode G. The gate capping pattern GP may be formed of or include, e.g., silicon nitride.

The substrate 1 may include a first logic region LR1, a second logic region LR2, and a memory region MR which are arranged in the first direction D1. A first logic p-type region RP1 and a first logic n-type region RN1, which are adjacent to each other, may be disposed in the first logic region LR1. A second logic p-type region RP2 and a second logic n-type region RN2, which are adjacent to each other, may be disposed in the second logic region LR2. A plurality of memory cells MC1 to MC4, which are two-dimensionally arranged in the first and second directions D1 and D2, may be disposed in the memory region MR.

First logic fins F(L1), which are spaced apart from each other by a first distance DS1, may be disposed in the first logic p-type region RP1. Second logic fins F(L2), which are spaced apart from each other by the first distance DS1, may be disposed in the first logic n-type region RN1. Third logic fins F(L3), which are spaced apart from each other by the first distance DS1, may be disposed in the second logic p-type region RP2. Fourth logic fins F(L4), which are spaced apart from each other by the first distance DS1, may be disposed in the second logic n-type region RN2. The first logic fins F(L1) and the third logic fins F(L3) may be doped with n-type impurities. The second logic fins F(L2) and the fourth logic fins F(L4) may be doped with p-type impurities.

The number of the first logic fins F(L1) may be equal to the number of the second logic fins F(L2). The number of the third logic fins F(L3) may be equal to the number of the fourth logic fins F(L4) and may be smaller than the number of the first logic fins F(L1). In an embodiment, the number of the first logic fins F(L1) may be, e.g., three, and the number of the third logic fins F(L3) may be, e.g., two. A second distance DS2 between a closest one of the first logic fins F(L1) to the first logic n-type region RN1 and a closest one of the second logic fins F(L2) to the first logic p-type region RP1 may be larger than a third distance DS3 between a closest one of the third logic fins F(L3) to the second logic n-type region RN2 and a closest one of the fourth logic fins F(L4) to the second logic p-type region RP2.

First shallow device isolation layers 3a may be respectively disposed between the first logic fins F(L1) and between the second logic fins F(L2). Second shallow device isolation layers 3b may be respectively disposed between the third logic fins F(L3) and between the fourth logic fins F(L4). Each of the first and second shallow device isolation layers 3a and 3b may have a first depth DT1 and a first width DS1. A deep device isolation layer 5 may be provided in the substrate 1, between the first logic p-type region RP1 and the first logic n-type region RN1, and between the second logic p-type region RP2 and the second logic n-type region RN2. The deep device isolation layer 5 may have a second depth DT2, which is larger than the first depth DT1.

A plurality of first logic gate electrodes G(L1) may be extended in the first direction D1 to cross the first logic fins F(L1) and the second logic fins F(L2). The first logic gate electrodes G(L1) may be spaced apart from each other in the second direction D2. First gate insulating layers GO(1) may be respectively interposed between the first logic gate electrodes G(L1) and the first and second logic fins F(L1) and F(L2).

A plurality of second logic gate electrodes G(L2) may be extended in the first direction D1 to cross the third logic fins F(L3) and the fourth logic fins F(L4). The second logic gate electrodes G(L2) may be spaced apart from each other in the second direction D2. Second gate insulating layers GO(2) may be respectively interposed between the second logic gate electrodes G(L2) and the third and fourth logic fins F(L3) and F(L4). The first gate insulating layers GO(1) may be formed of or include a material different from the second gate insulating layers GO(2). The first logic gate electrodes G(L1) may be formed of or include a material different from the second logic gate electrodes G(L2).

Figure 3:
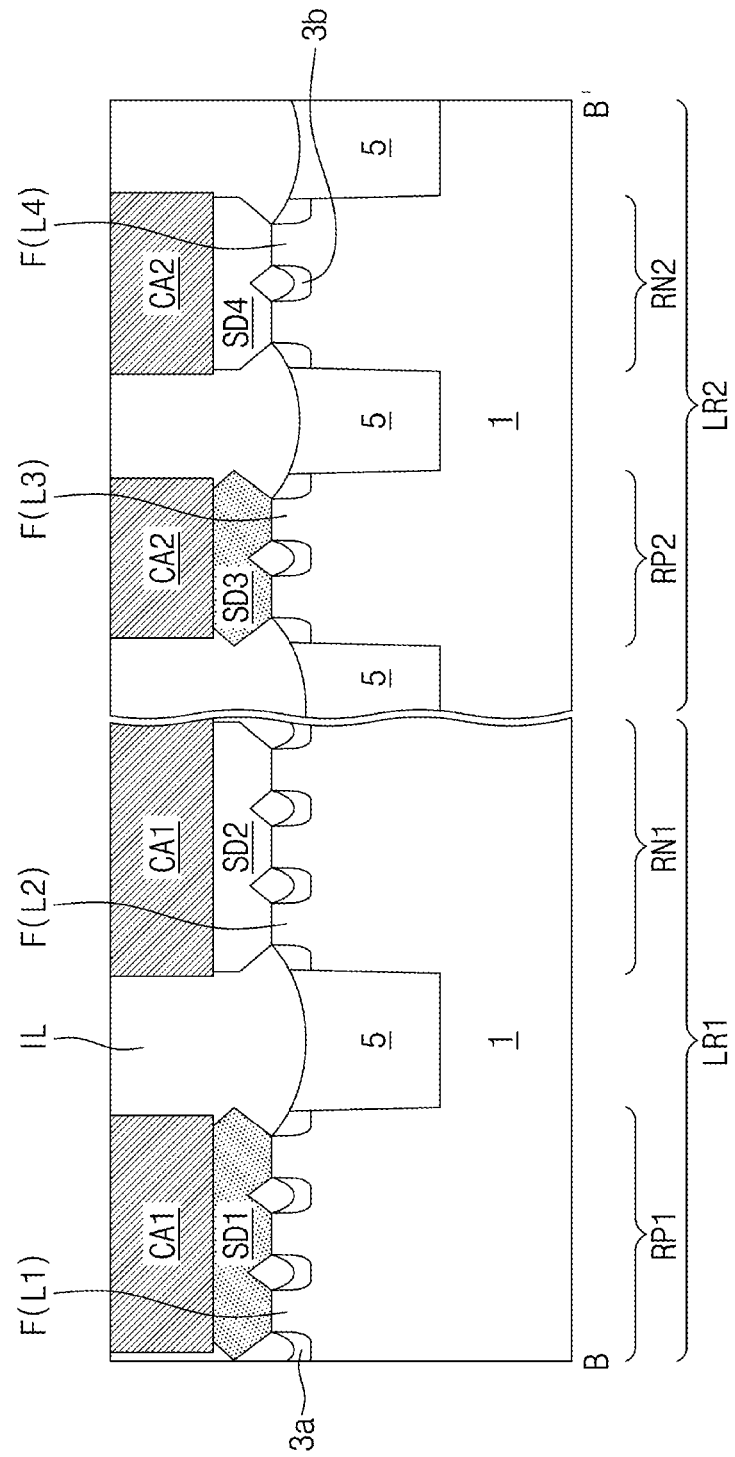
FIG. 3 is a cross-sectional view taken along line B-B' of FIG. 1.

FIG. 3 is a cross-sectional view taken along a line B-B' of FIG. 1.

Referring to FIGS. 1 and 3, first source/drain patterns SD1 may be disposed on the first logic fins F(L1) and at both sides of the first logic gate electrodes G(L1). Second source/drain patterns SD2 may be disposed on the second logic fins F(L2) and at both sides of the first logic gate electrodes G(L1). Third source/drain patterns SD3 may be disposed on the third logic fins F(L3) and at both sides of the second logic gate electrodes G(L2). Fourth source/drain patterns SD4 may be disposed on the fourth logic fins F(L4) and at both sides of the second logic gate electrodes G(L2). Each of the first to fourth source/drain patterns SD1 to SD4 may have portions, which have diamond-shaped sections and are connected to each other.

Each of the first and third source/drain patterns SD1 and SD3 may be a silicon germanium epitaxial pattern that is doped with, e.g., boron. Each of the second and fourth source/drain patterns SD2 and SD4 may be a silicon epitaxial pattern that is doped with, e.g., phosphorus or arsenic. The logic fins F(L1) to F(L4) below the first to fourth source/drain patterns SD1 to SD4 may have top surfaces that are located at the same level as the topmost portions of the first and second shallow device isolation layers 3a and 3b. Top surfaces of the first and second shallow device isolation layers 3a and 3b and the deep device isolation layer 5, which are adjacent to the first to fourth source/drain patterns SD1 to SD4, may be recessed. The first to fourth source/drain patterns SD1 to SD4, the first and second shallow device isolation layers 3a and 3b, and the deep device isolation layer 5 may be covered with an interlayer insulating layer IL. First contact plugs CA1 may be provided to penetrate the interlayer insulating layer IL and to be in contact with the first and second source/drain patterns SD1 and SD2. Second contact plugs CA2 may be provided to penetrate the interlayer insulating layer IL and to be in contact with the third and fourth source/drain patterns SD3 and SD4.

In the embodiment of FIGS. 1 and 2, each of the memory cells MC1 to MC4 may correspond to a static random-access memory (SRAM) memory cell. The memory cells MC1 to MC4 may be arranged to be symmetric to each other in the first and second directions D1 and D2. For example, the memory cells MC1 to MC4 may include a first memory cell MC1 and a second memory cell MC2, which are symmetric to each other in the first direction D1. The memory cells MC1 to MC4 may further include a third memory cell MC3, which is symmetric to the first memory cell MC1 in the second direction D2. The memory cells MC1 to MC4 may further include a fourth memory cell MC4, which is symmetric to the second memory cell MC2 in the second direction D2. The first memory cell MC1 and the third memory cell MC3 may share some of active contacts AC. The second memory cell MC2 and the fourth memory cell MC4 may share others of the active contacts AC.

In the memory region MR, first to eighth memory fins F(M1) to F(M8) may be arranged, e.g., spaced apart, in the first direction D1 and parallel to each other. The first to fourth memory fins F(M1) to F(M4) may be disposed in the first memory cell MC1 and the third memory cell MC3. The fifth to eighth memory fins F(M5) to F(M8) may be disposed in the second memory cell MC2 and the fourth memory cell MC4. The first to fourth memory fins F(M1) to F(M4) may be symmetric to the fifth to eighth memory fins F(M5) to F(M8).

The first, fourth, fifth, and eighth memory fins F(M1), F(M4), F(M5), and F(M8) may be line-shaped patterns extending in the second direction D2, e.g., the first, fourth, fifth, and eighth memory fins F(M1), F(M4), F(M5), and F(M8) may be line-shaped patterns that extend continuously along at least entire combined lengths of the first and third memory cell MC1 and MC3. The first, fourth, fifth, and eighth memory fins F(M1), F(M4), F(M5), and F(M8) may be doped with impurities of a first conductivity type (e.g., boron atoms of p-type). The second, third, sixth, and seventh memory fins F(M2), F(M3), F(M6), and F(M7) may be bar-shaped patterns extending in the second direction D2, e.g., each of the second, third, sixth, and seventh memory fins F(M2), F(M3), F(M6), and F(M7) may have discontinuous portions spaced apart from each other in the second direction D2. The second, third, sixth, and seventh memory fins F(M2), F(M3), F(M6), and F(M7) may be doped with impurities (e.g., phosphorus or arsenic) that are of a different conductivity type from the first conductivity type.

First to fourth memory gate electrodes G(M1) to G(M4) may be provided on the first to eighth memory fins F(M1) to F(M8) to cross the first to eighth memory fins F(M1) to F(M8) in the first direction D1. A memory gate insulating layer GO(3) may be interposed between the first to eighth memory fins F(M1) to F(M8) and the first to fourth memory gate electrodes G(M1) to G(M4). An insulating isolation pattern SP may be interposed between the first to fourth memory gate electrodes G(M1) to G(M4).

A fourth distance DS4 between the second and third memory fins F(M2) and F(M3) may be equal to a distance between the sixth and seventh memory fins F(M6) and F(M7). A third shallow device isolation layer 3c may be interposed between the second and third memory fins F(M2) and F(M3), and between the sixth and seventh memory fins F(M6) and F(M7). The third shallow device isolation layer 3c may have a third depth DT3.

A fifth distance DS5 between the first and second memory fins F(M1) and F(M2) may be equal to a distance between the third and fourth memory fins F(M3) and F(M4), a distance between the fifth and sixth memory fins F(M5) and F(M6), and a distance between the seventh and eighth memory fins F(M7) and F(M8). A fourth shallow device isolation layer 3d may be interposed between the first and second memory fins F(M1) and F(M2), between the third and fourth memory fins F(M3) and F(M4), between the fifth and sixth memory fins F(M5) and F(M6), and between the seventh and eighth memory fins F(M7) and F(M8). The fourth shallow device isolation layer 3d may have a fourth depth DT4.

The fourth and fifth memory fins F(M4) and F(M5) may be spaced apart from each other by a sixth distance DS6. A fifth shallow device isolation layer 3e may be disposed between the fourth and fifth memory fins F(M4) and F(M5). The fifth shallow device isolation layer 3e may have a fifth depth DT5.

A sidewall of the fifth shallow device isolation layer 3e may have an inflection point IFP. For example, a lower corner portion of the fifth shallow device isolation layer 3e may have an inflection point IFP where a profile, e.g., curvature direction, of the bottom portion changes sharply, e.g., concaves inwardly.

The fifth distance DS5 may be larger than the fourth distance DS4, and may be smaller than the sixth distance DS6. The fourth distance DS4 may be larger than the first distance DS1. The sixth distance DS6 may be smaller than the second distance DS2. The fourth depth DT4 may be larger than the third depth DT3 and may be smaller than the fifth depth DT5. The fifth depth DT5 may be smaller than the second depth DT2. The third depth DT3 may be smaller than the first depth DT1. It is noted that distances DS1 through DS6 are measured along the first direction D1, and distances DT1 through DT5 are measured along a vertical direction perpendicular to both the first and second directions D1 and D2.

Figure 4:
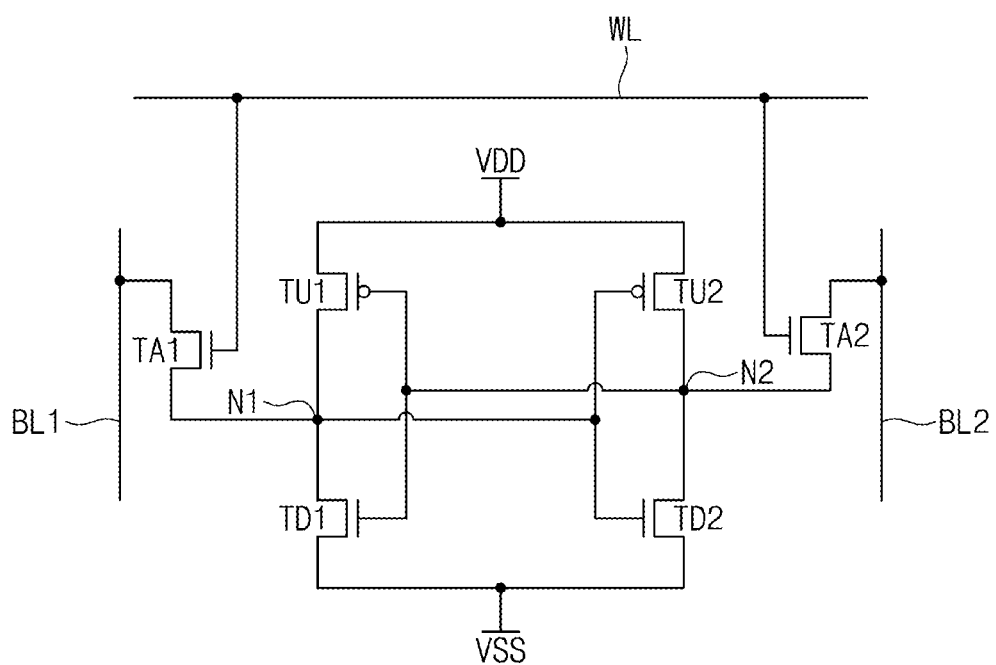
FIG. 4 is an equivalent circuit diagram of an SRAM cell according to embodiments.

FIG. 4 is an equivalent circuit diagram of an SRAM cell according to embodiments.

Referring to FIG. 4, the SRAM cell may include a first pull-up transistor TU1, a first pull-down transistor TD1, a second pull-up transistor TU2, a second pull-down transistor TD2, a first access transistor TA1, and a second access transistor TA2. The first and second pull-up transistors TU1 and TU2 may be PMOS transistors. The first and second pull-down transistors TD1 and TD2 and the first and second access transistors TA1 and TA2 may be NMOS transistors.

A first source/drain of the first pull-up transistor TU1 and a first source/drain of the first pull-down transistor TD1 may be connected to a first node N1. A second source/drain of the first pull-up transistor TU1 may be connected to a power line VDD, and a second source/drain of the first pull-down transistor TD1 may be connected to a ground line VSS. A gate of the first pull-up transistor TU1 and a gate of the first pull-down transistor TD1 may be electrically connected to each other. The first pull-up transistor TU1 and the first pull-down transistor TD1 may constitute a first inverter. The connected gates of the first pull-up transistor TU1 and the first pull-down transistor TD1 may correspond to an input terminal of the first inverter, and the first node N1 may correspond to an output terminal of the first inverter.

A first source/drain of the second pull-up transistor TU2 and a first source/drain of the second pull-down transistor TD2 may be connected to a second node N2. A second source/drain of the second pull-up transistor TU2 may be connected to the power line VDD, and a second source/drain of the second pull-down transistor TD2 may be connected to the ground line VSS. A gate of the second pull-up transistor TU2 and a gate of the second pull-down transistor TD2 may be electrically connected to each other. The second pull-up transistor TU2 and the second pull-down transistor TD2 may constitute a second inverter. The connected gates of the second pull-up transistor TU2 and the second pull-down transistor TD2 may correspond to an input terminal of the second inverter, and the second node N2 may correspond to an output terminal of the second inverter.

The first and second inverters may be combined to constitute a latch structure. For example, the gates of the first pull-up and first pull-down transistors TU1 and TD1 may be electrically connected to the second node N2, and the gates of the second pull-up and second pull-down transistors TU2 and TD2 may be electrically connected to the first node N1. A first source/drain of the first access transistor TA1 may be connected to the first node N1, and a second source/drain of the first access transistor TA1 may be connected to a first bit line BL1. A first source/drain of the second access transistor TA2 may be connected to the second node N2, and a second source/drain of the second access transistor TA2 may be connected to a second bit line BL2. Gates of the first and second access transistors TA1 and TA2 may be electrically coupled to a word line WL. As a result, the SRAM cell according to embodiments may be realized.

Figure 5:
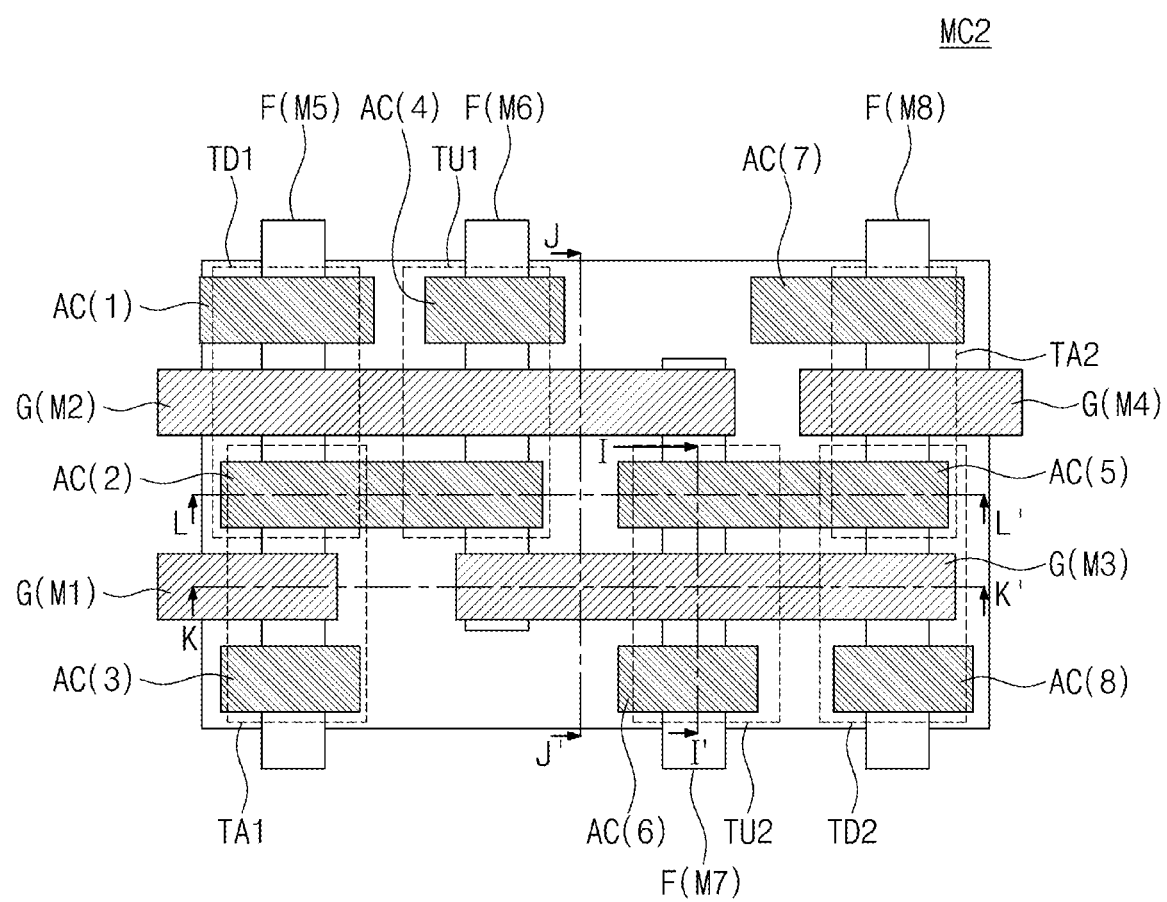
FIG. 5 is an enlarged plan view of a portion of a second memory cell in FIG. 1.
Figure 6A:
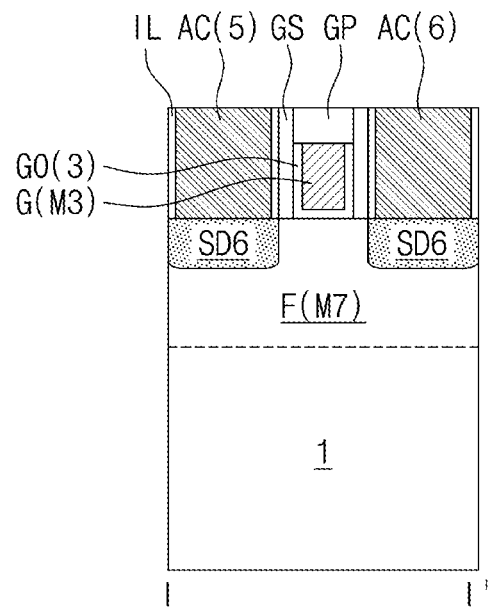
FIGS. 6A to 6D are cross-sectional views along lines I-I', J-J', K-K', and L-L' of FIG. 5, respectively.
Figure 6B:
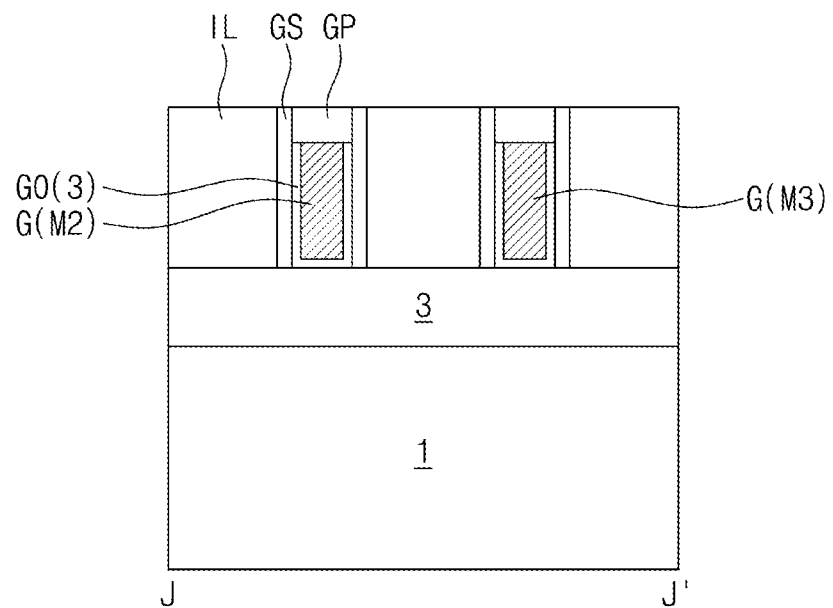
Figure 6C:
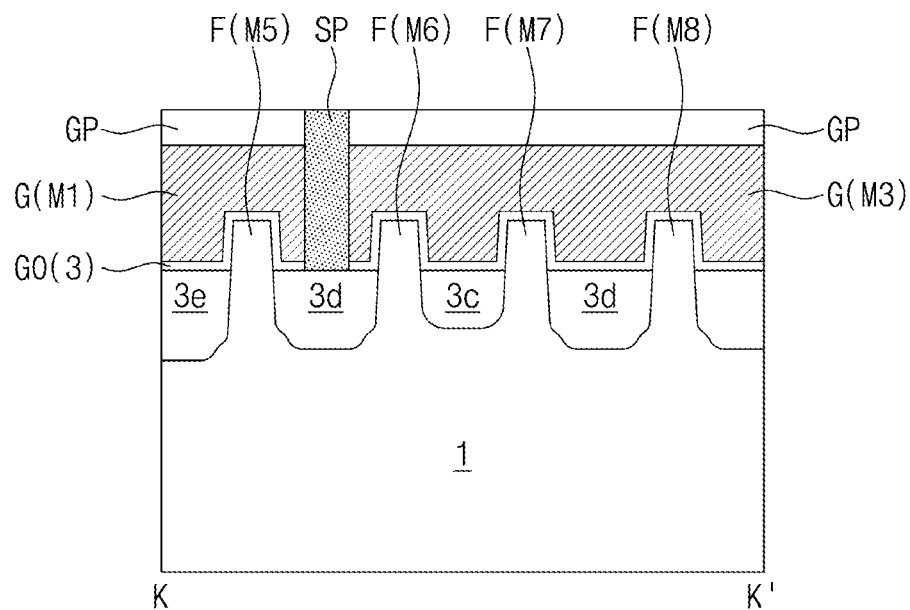
Figure 6D:
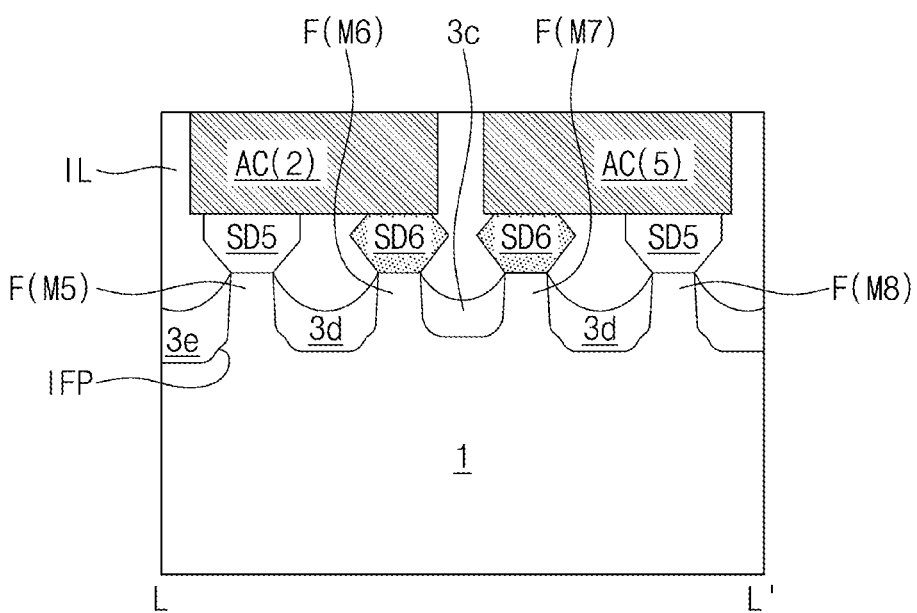

FIG. 5 is an enlarged plan view illustrating a portion of the second memory cell MC2 of FIG. 1. FIGS. 6A to 6D are cross-sectional views taken along lines I-I', J-J', K-K', and L-L' of FIG. 5, respectively.

Referring to FIGS. 1, 5, and 6A to 6D, fifth source/drain patterns SD5 may be disposed on the first, fourth, fifth, and eighth memory fins F(M1), F(M4), F(M5), and F(M8). Sixth source/drain patterns SD6 may be disposed on the second, third, sixth, and seventh memory fins F(M2), F(M3), F(M6), and F(M7). The fifth source/drain patterns SD5 may be silicon epitaxial patterns that are doped with, e.g., phosphorus or arsenic. The sixth source/drain patterns SD6 may be silicon germanium epitaxial patterns that are doped with, e.g., boron. The fifth and sixth source/drain patterns SD5 and SD6 may be spaced apart from each other in the first direction D1. The memory fins F(M1) to F(M8) below the fifth and sixth source/drain patterns SD5 and SD6 may have top surfaces that are located at the same level as the topmost portions of the third to fifth shallow device isolation layers 3c-3e. Top surfaces of the third to fifth shallow device isolation layers 3c-3e, which are adjacent to the fifth and sixth source/drain patterns SD5 and SD6, may be recessed.

The first memory gate electrode G(M1) may be provided to cross the fifth memory fin F(M5). The third memory gate electrode G(M3) may be spaced apart from the first memory gate electrode G(M1) in the first direction D1 by the insulating isolation pattern SP. The third memory gate electrode G(M3) may be provided to cross the sixth to eighth memory fins F(M6) to F(M8). The second memory gate electrode G(M2) may be provided to cross the fifth to seventh memory fins F(M5) to F(M7). The fourth memory gate electrode G(M4) may be spaced apart from the second memory gate electrode G(M2) in the first direction D1 by the insulating isolation pattern SP. The fourth memory gate electrode G(M4) may be provided to cross the eighth memory fin F(M8).

First to eighth active contacts AC1 to AC8 may be provided at both sides of each of first to fourth memory gate electrodes G(M1) to G(M4). The first to eighth active contacts AC1 to AC8 may be provided to penetrate an upper portion of the interlayer insulating layer IL and may be coupled to the fifth and sixth source/drain patterns SD5 and SD6. The first to eighth active contacts AC(1) to AC(8) may be formed of or include at least one of conductive metal nitrides (e.g., titanium nitride or tantalum nitride) or metallic materials (e.g., titanium, tantalum, tungsten, copper, or aluminum).

In an embodiment, the first to fourth memory gate electrodes G(M1) to G(M4) and the fifth and sixth source/drain patterns SD5 and SD6, which are disposed near them, may constitute memory transistors. The memory transistors shown in FIG. 5 may include the first pull-up transistor TU1, the first pull-down transistor TD1, the second pull-up transistor TU2, the second pull-down transistor TD2, the first access transistor TA1, and the second access transistor TA2 previously described with reference to FIG. 4.

In the semiconductor device according to embodiments, the fins may be provided to have a small distance therebetween, compared with the conventional structure, and this may make it possible to further increase an integration density of the semiconductor device. The semiconductor device may have a vertical section similar to that shown in FIG. 6A, when it is taken along line C-C' of FIG. 1. In the present specification, the memory cells MC1 to MC4 may be referred to as memory cell regions.

Figure 7A:
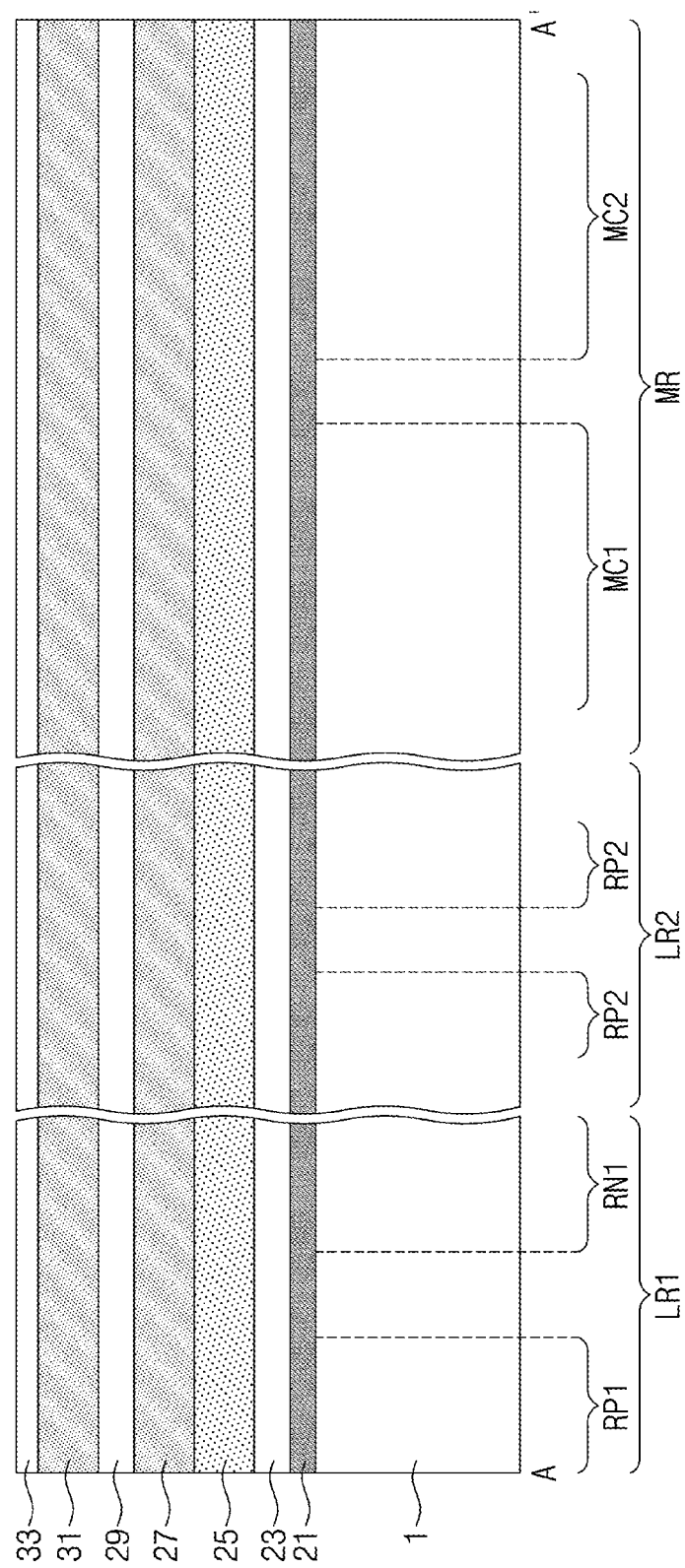
FIGS. 7A to 7R are cross-sectional views of stages in a process of fabricating a semiconductor device having the cross-sectional structure of FIG. 2.
Figure 7B:
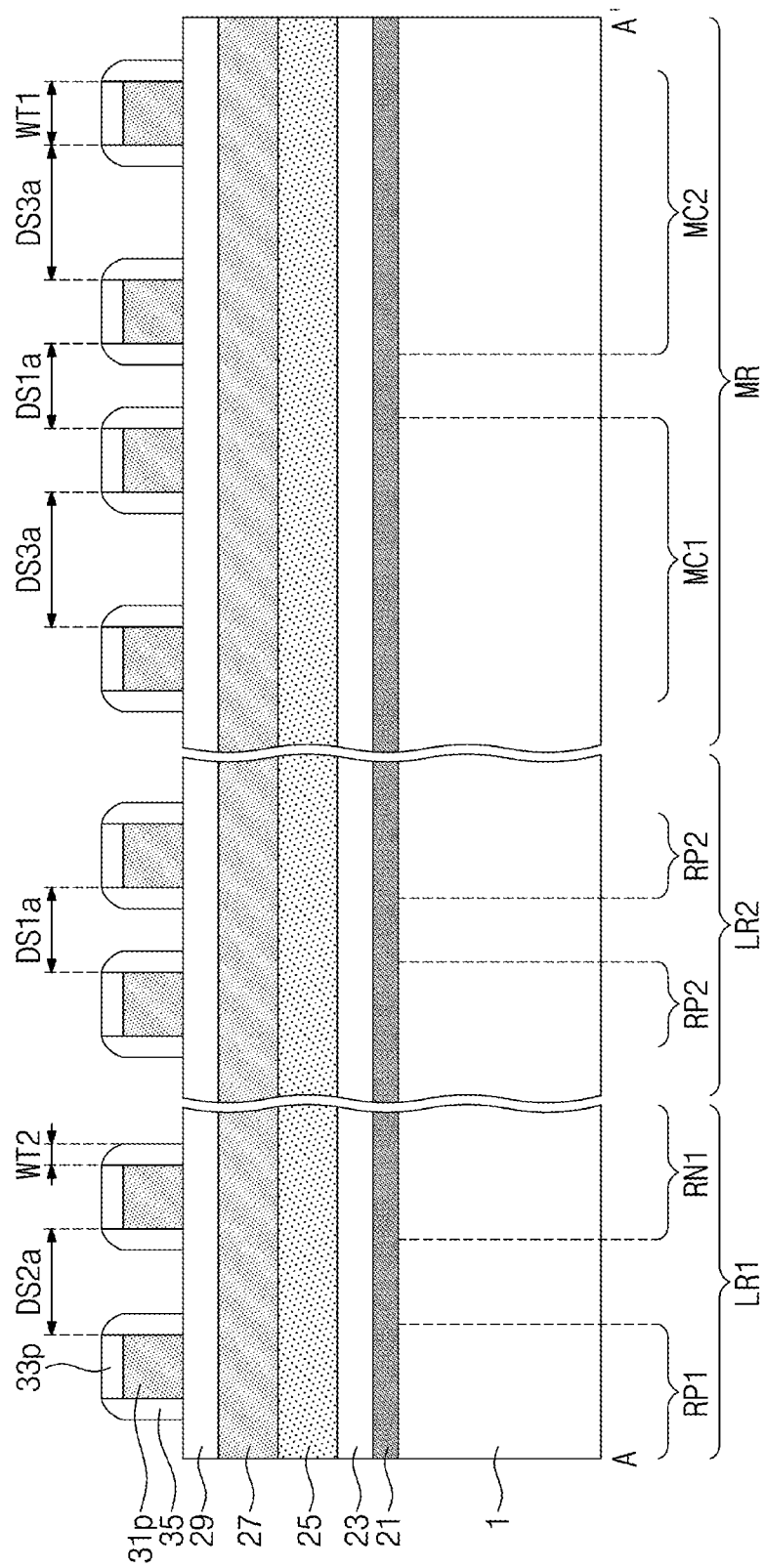
Figure 7C:
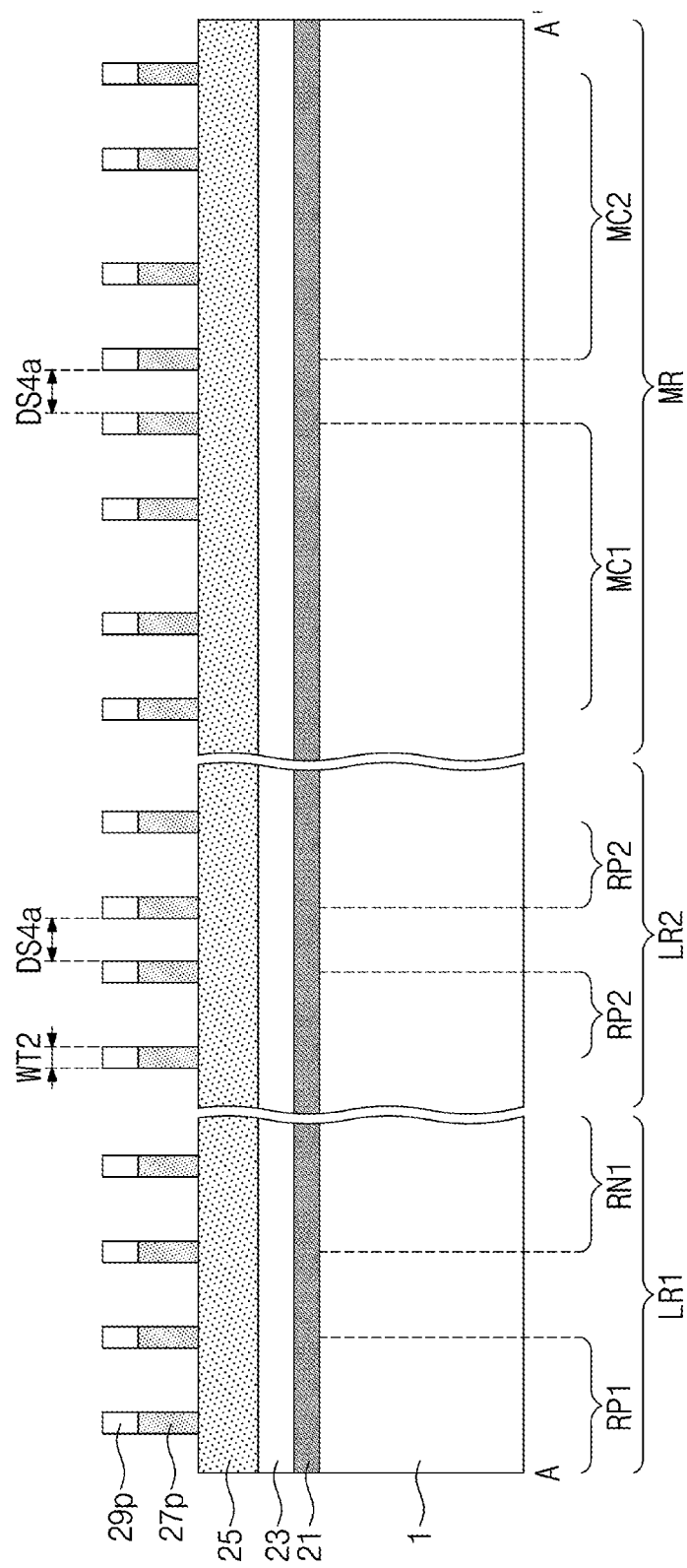
Figure 7D:
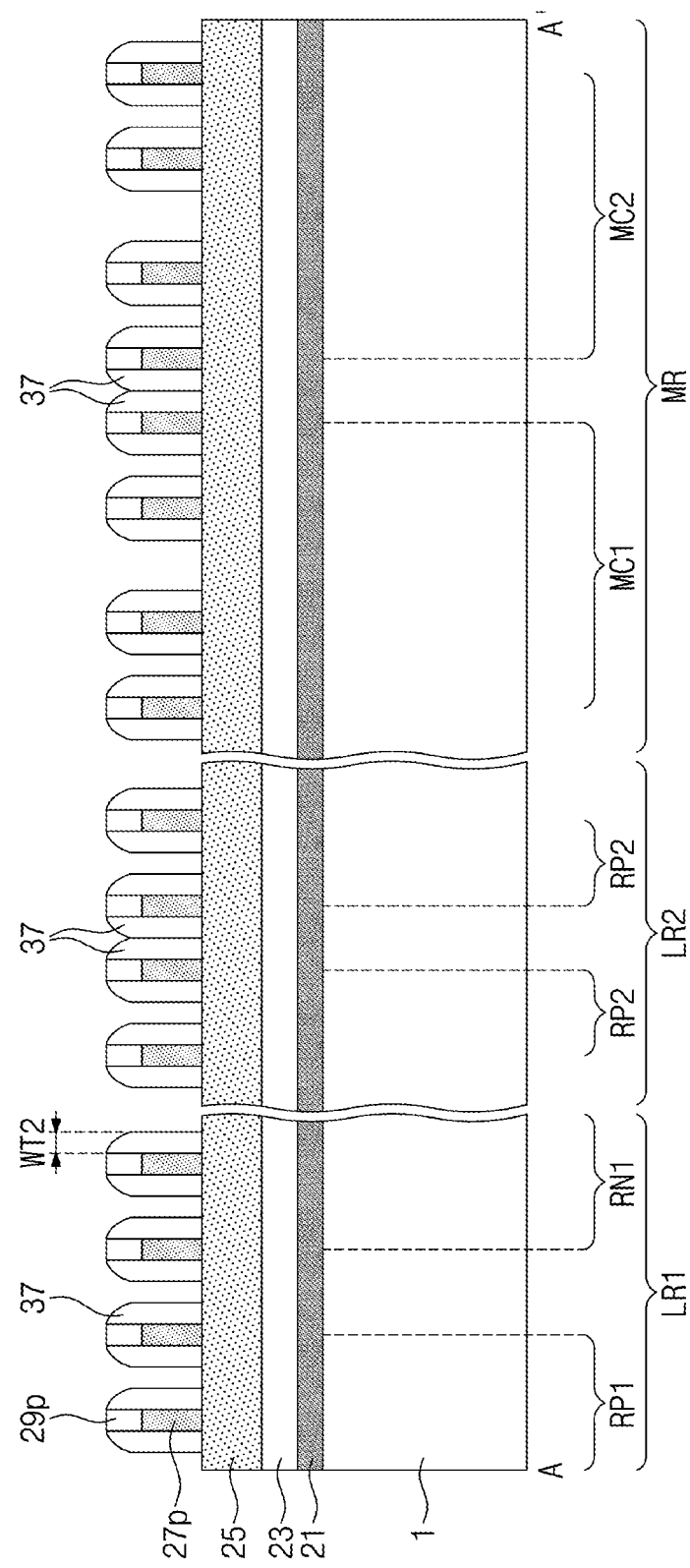
Figure 7E:
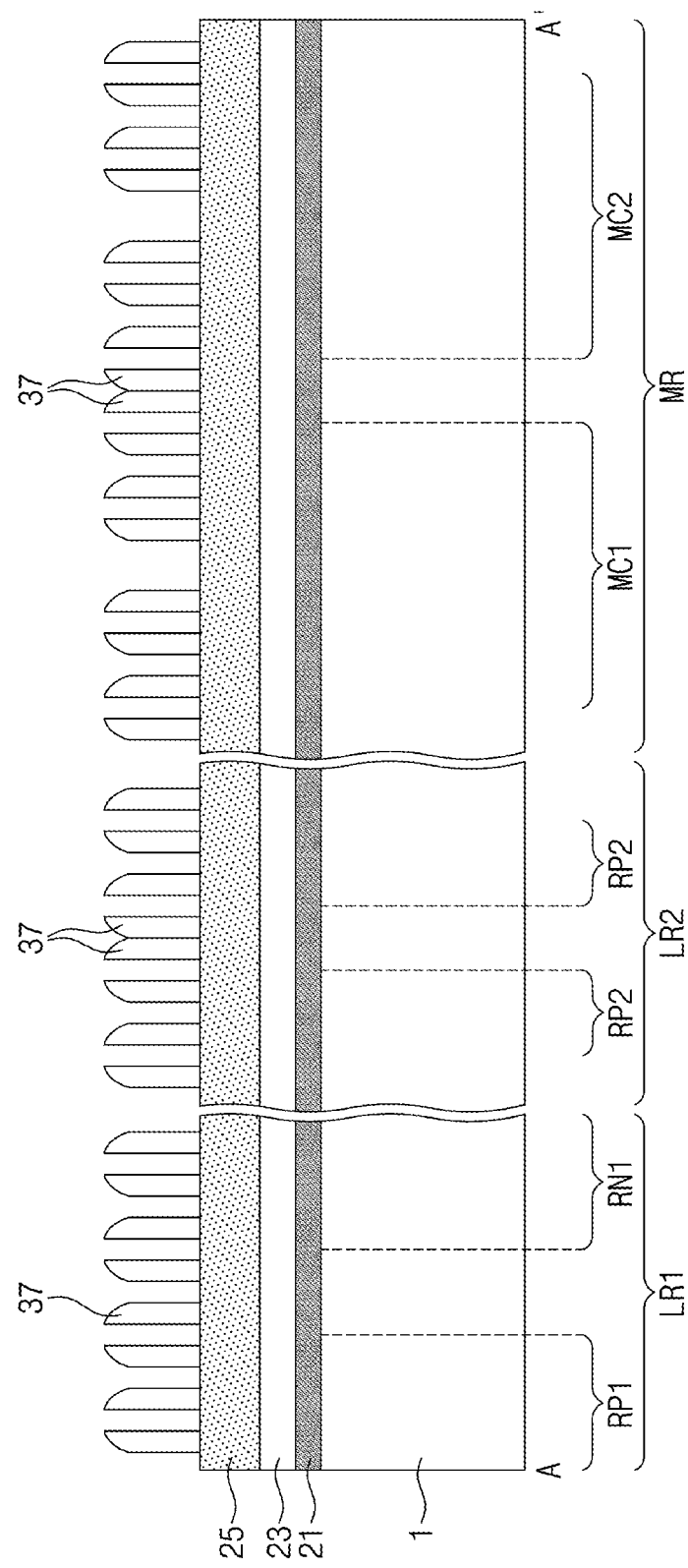
Figure 7F:
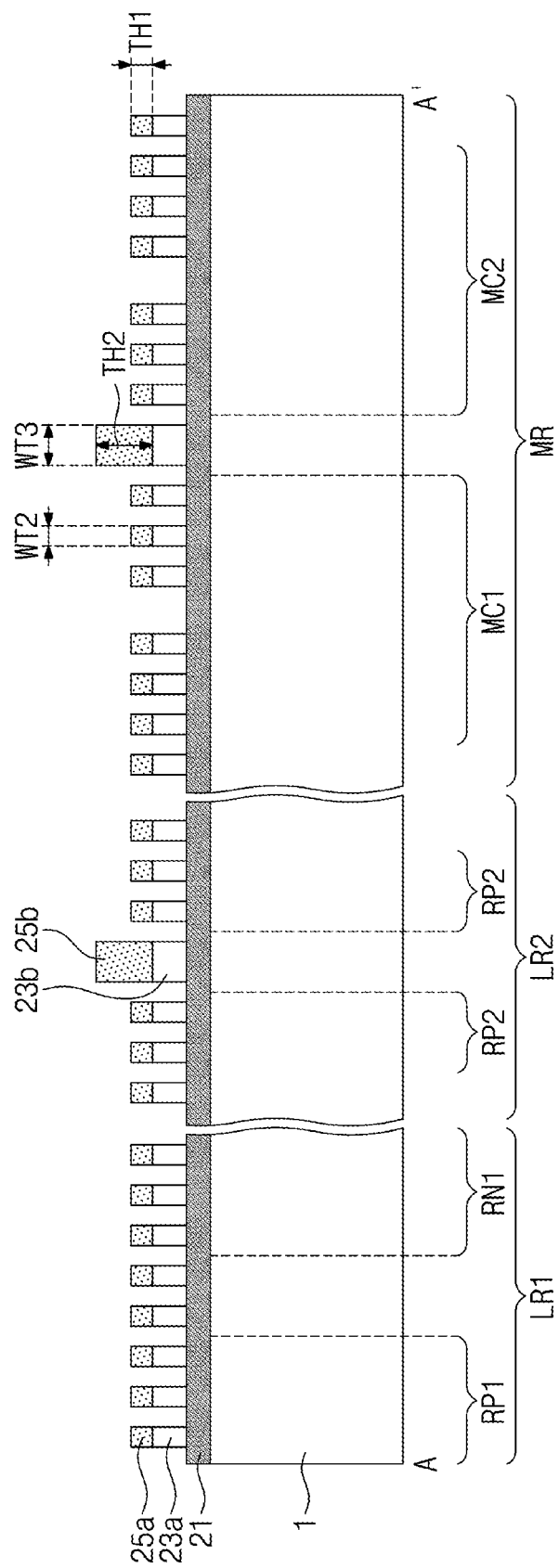
Figure 7G:
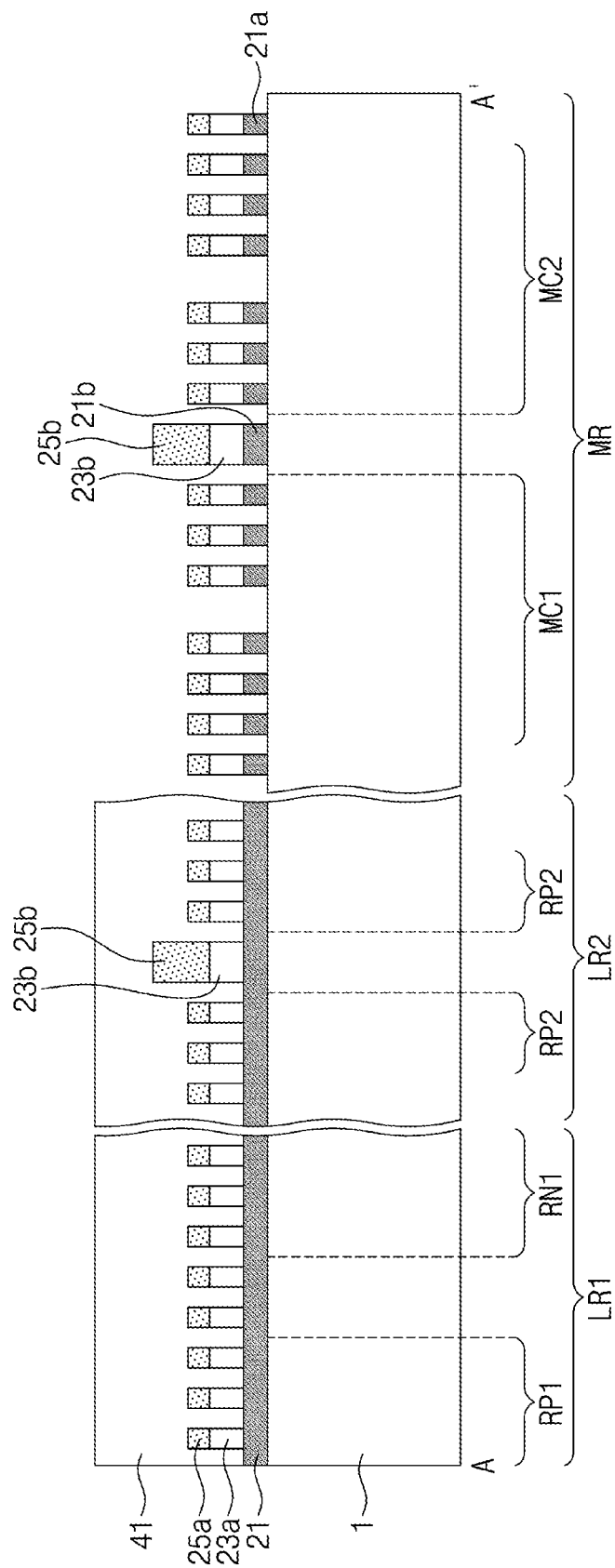
Figure 7I:
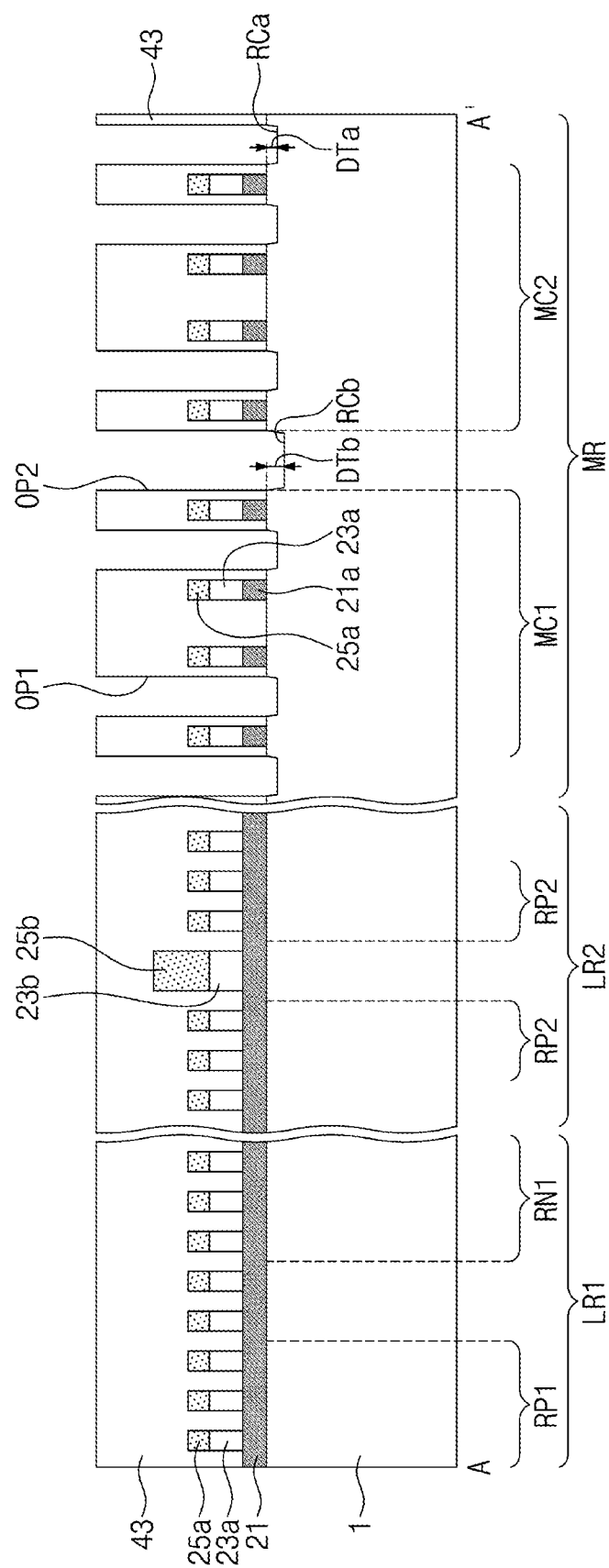
Figure 7J:
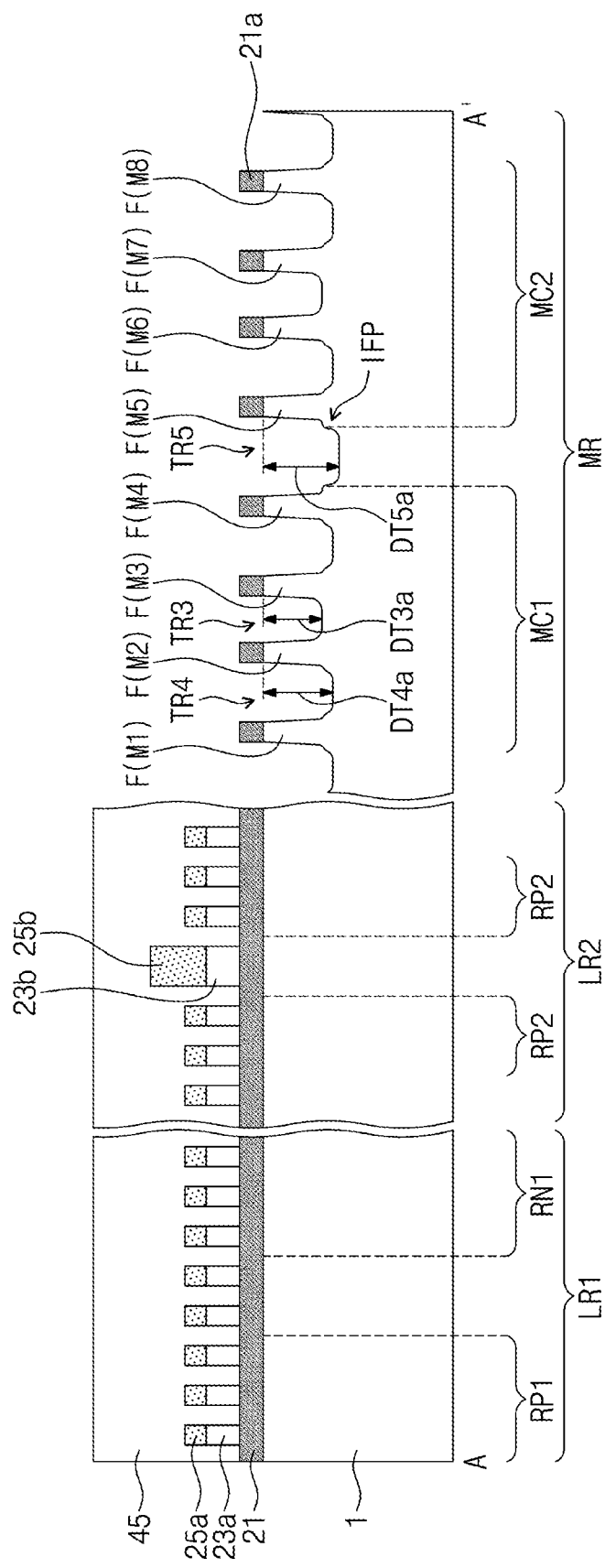
Figure 7K:
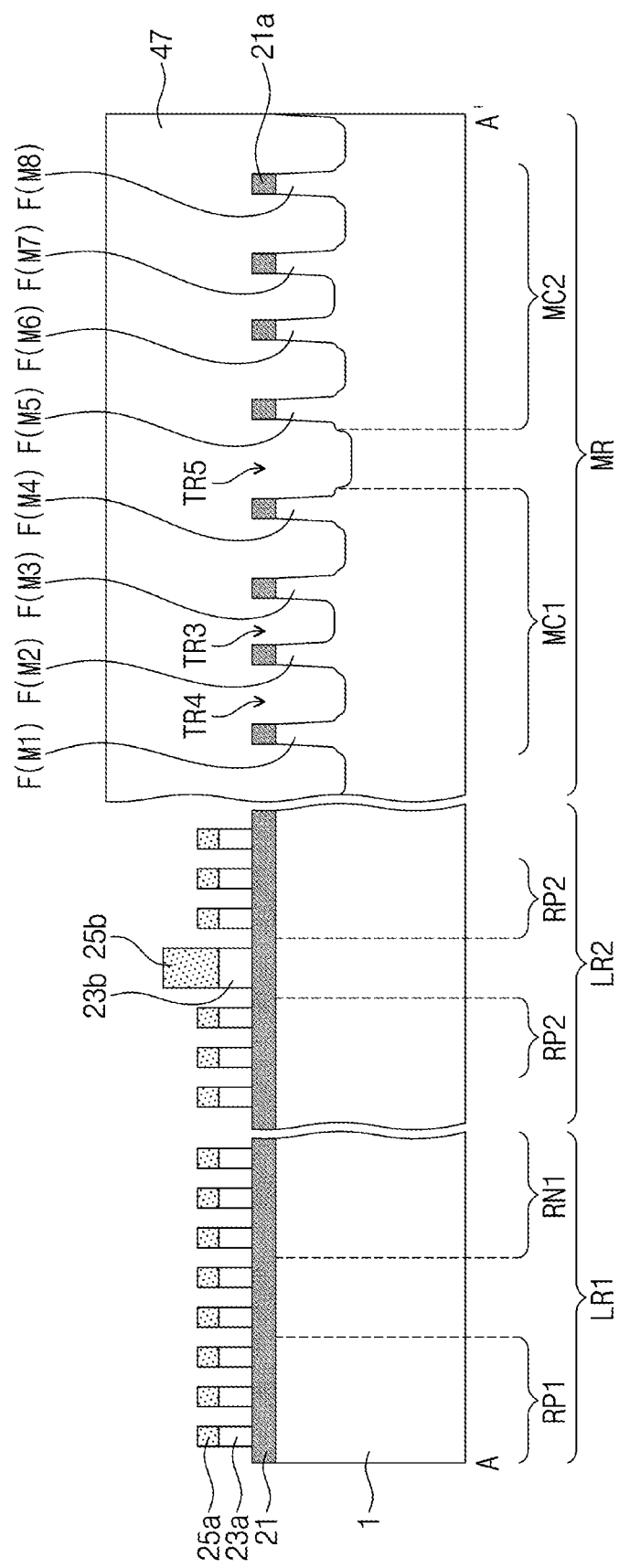
Figure 7L:
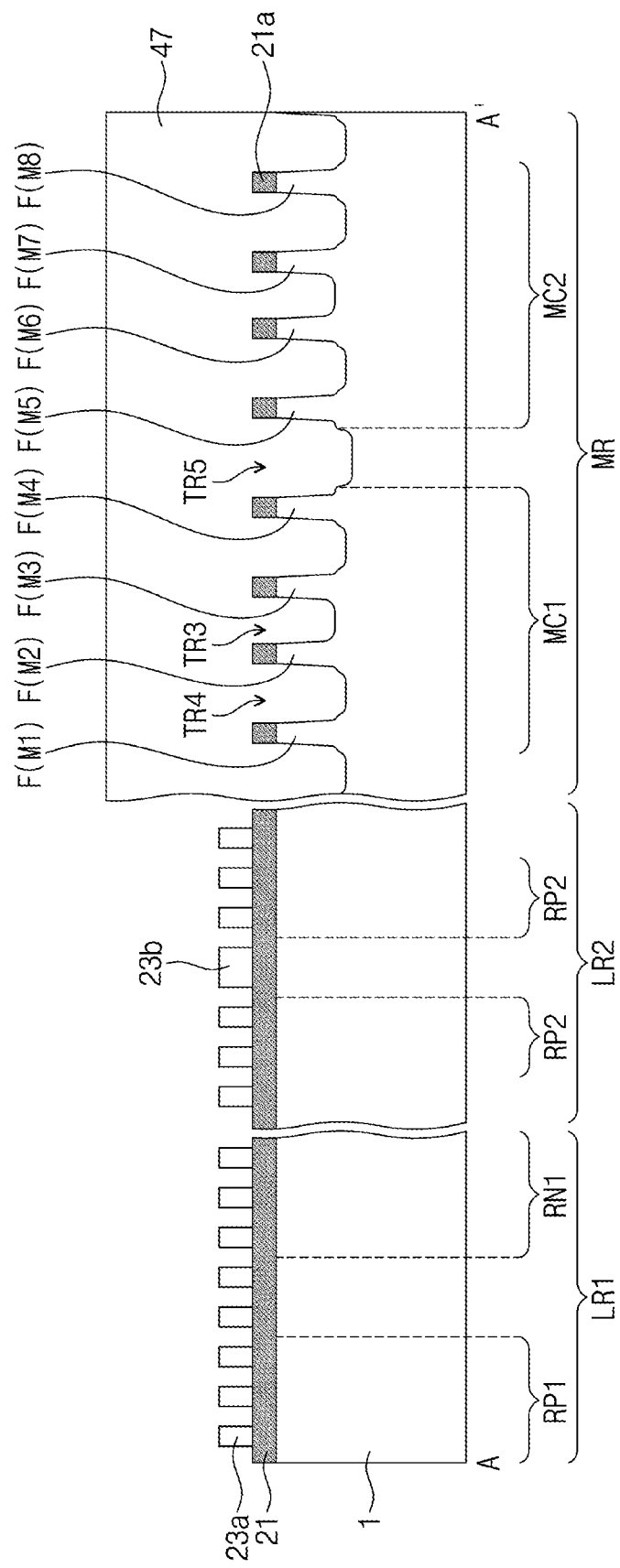
Figure 7M:
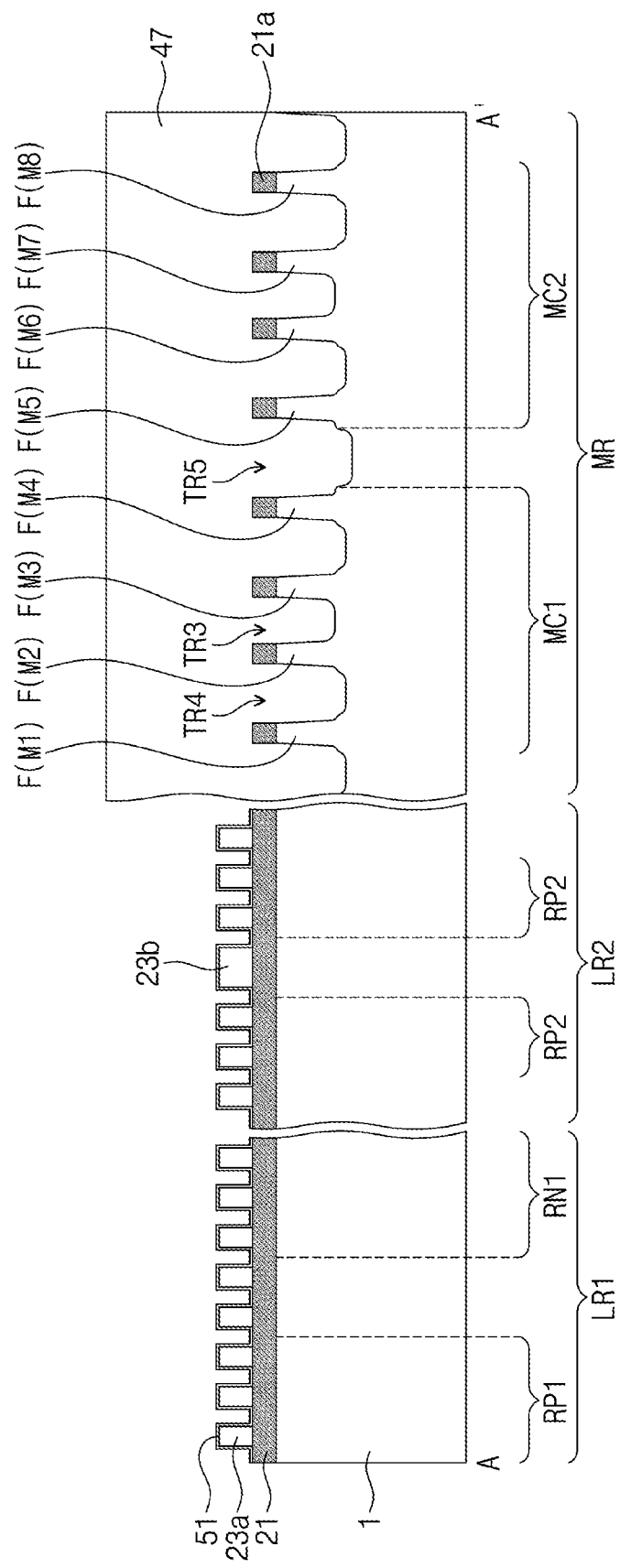
Figure 7N:
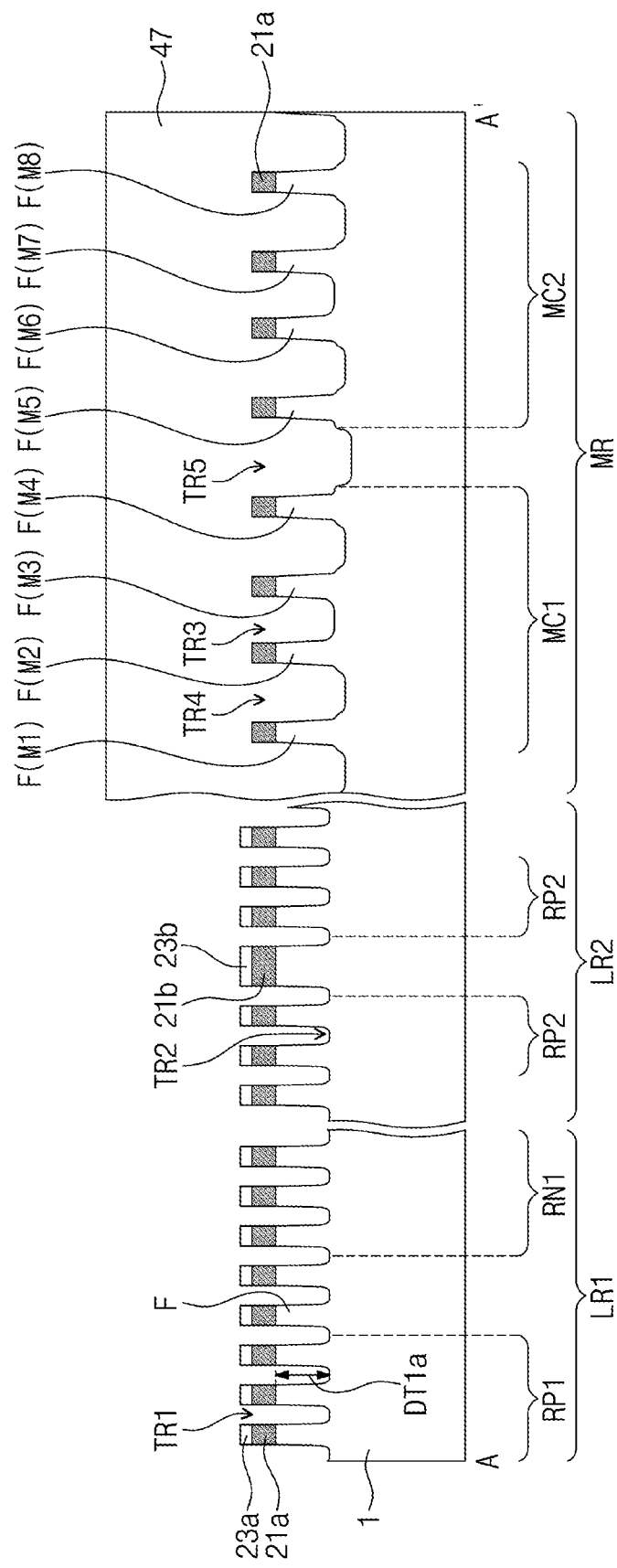
Figure 70:
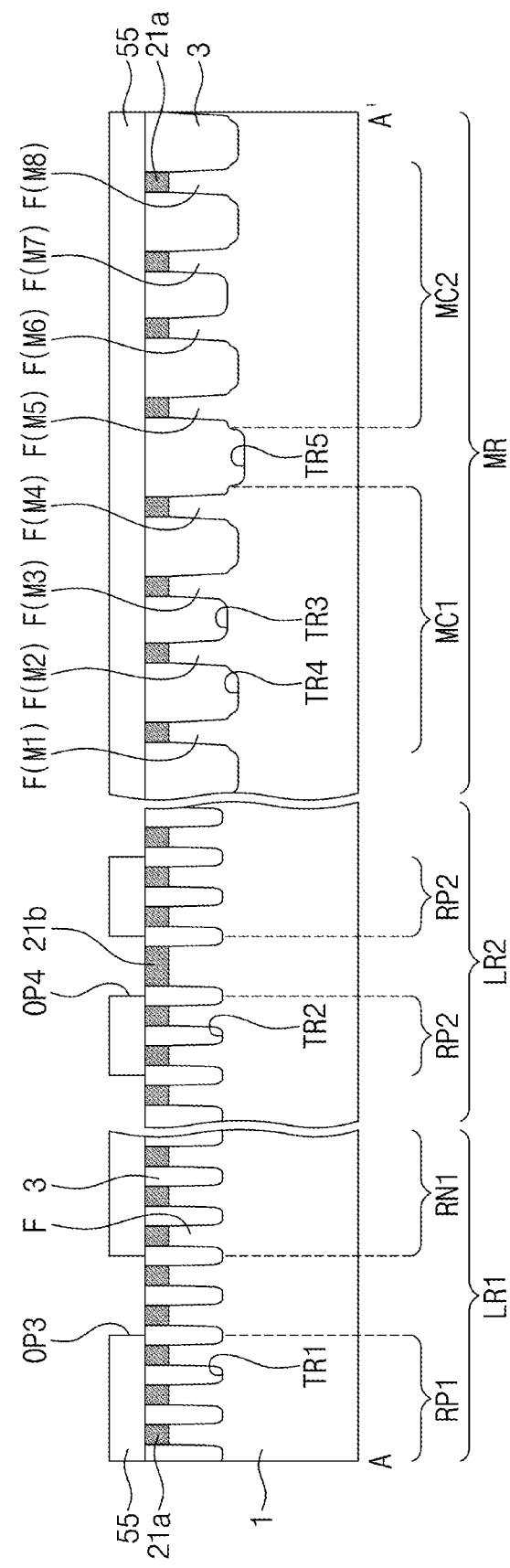
Figure 7P:
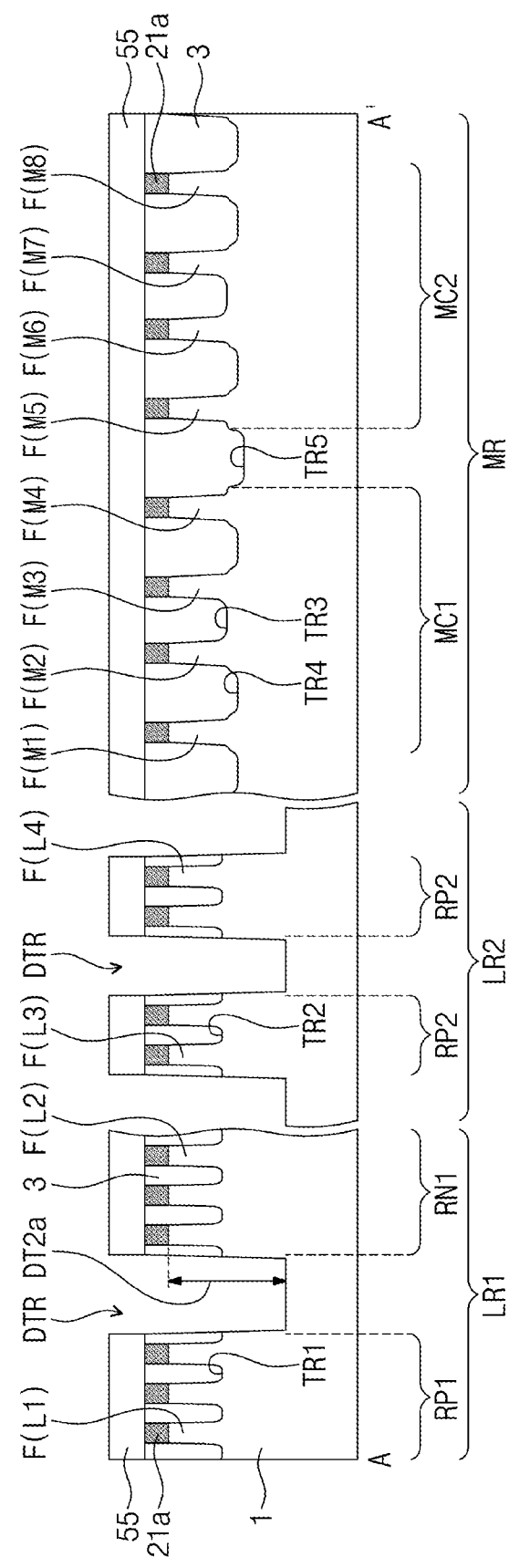
Figure 7Q:
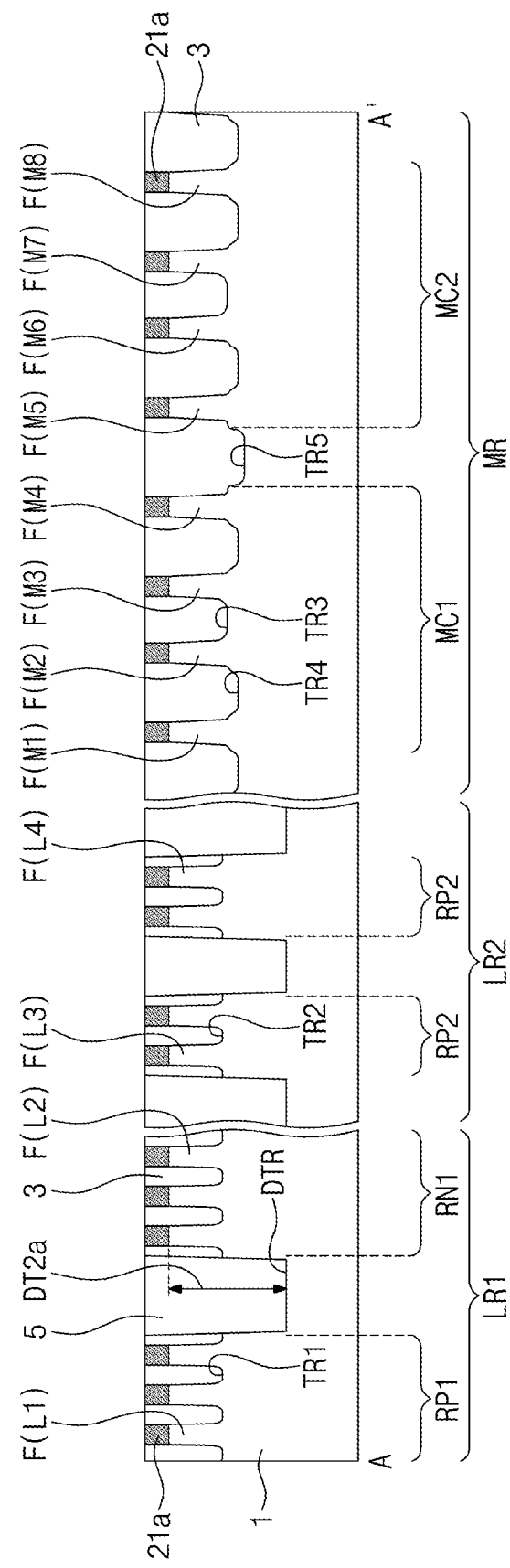
Figure 7R:
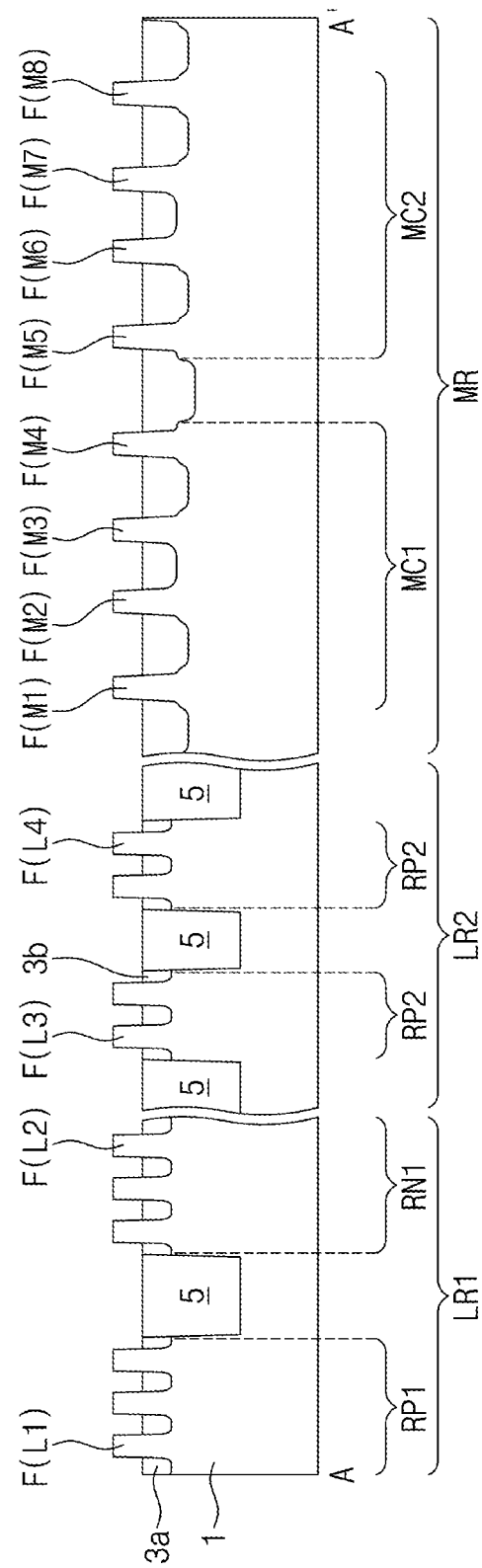

FIGS. 7A to 7R are cross-sectional views of stages in a process of fabricating the semiconductor device having the cross-sectional structure of FIG. 2. FIGS. 8A to 8E are plan views of stages in a process of fabricating the semiconductor device having the planar structure of FIG. 1.

Referring to FIG. 7A, the substrate 1 may be provided. The substrate 1 may include the logic regions LR1 and LR2 and the memory region MR, as described above. A first mask layer 21, a second mask layer 23, a third mask layer 25, a fourth mask layer 27, a fifth mask layer 29, a sixth mask layer 31, and a seventh mask layer 33 may be sequentially stacked on the substrate 1. Each of the first to seventh mask layers 21, 23, 25, 27, 29, 31, and 33 may be formed of or include a material having an etch selectivity with respect to other mask layers adjacent thereto. For example, the first mask layer 21 may be formed of or include silicon nitride, the second mask layer 23 may be formed of or include low-pressure tetraethyl orthosilicate (LPTEOS), the third mask layer 25 may be formed of or include polysilicon, the fourth mask layer 27 may be formed of or include amorphous carbon layer (ACL), the fifth mask layer 29 may be formed of or include SiON, the sixth mask layer 31 may be formed of or include spin-on hardmask (SOH), and the seventh mask layer 33 may be formed of or include SiON.

Referring to FIG. 7B, photoresist patterns may be formed on the seventh mask layer 33. The photoresist patterns may be line-shaped patterns extending in the second direction D2. The seventh mask layer 33 and the sixth mask layer 31 may be sequentially etched using the photoresist patterns as an etch mask, and as a result, sixth mask patterns 31*p* and seventh mask patterns 33*p* may be formed to expose a top surface of the fifth mask layer 29. Thereafter, the photoresist patterns may be removed. Each of the sixth and seventh mask patterns 31*p* and 33*p* may be formed to have a first width WT1. Next, an eighth mask layer may be formed to conformally cover the fifth mask layer 29 and then may be anisotropically etched to expose top surfaces of the seventh mask patterns 33*p* and the top surface of the fifth mask layer 29 and to form eighth mask patterns 35 covering side surfaces of the sixth and seventh mask patterns 31*p* and 33*p*. Here, each of the eighth mask patterns 35 may be formed to have a second width WT2. In an embodiment, the first width WT1 may be, e.g., equal, three times the second width WT2. The eighth mask patterns 35 may be line-shaped patterns extending in the second direction D2.

An adjacent pair of the seventh mask patterns 33*p*, which are respectively disposed in the first memory cell MC1 and the second memory cell MC2 and in the second logic p-type region RP2 and the second logic n-type region RN2, may be spaced apart from each other by a first preliminary distance DS1*a*. In an embodiment, the first preliminary distance DS1*a* may be four times the second width WT2. An adjacent pair of the seventh mask patterns 33*p*, which are respectively disposed in the first logic p-type region RP1 and the first logic n-type region RN1, may be spaced apart from each other by a second preliminary distance DS2*a*. In an embodiment, the second preliminary distance DS2*a* may be six times the second width WT2. An adjacent pair of the seventh mask patterns 33*p*, which are disposed in each of the first memory cell MC1 and the second memory cell MC2, may be spaced apart from each other by a third preliminary distance DS3*a*. The third preliminary distance DS3*a* may be larger than or equal to the second preliminary distance DS2*a*.

Referring to FIGS. 7B and 7C, the seventh mask patterns 33*p* and the sixth mask patterns 31*p* may be sequentially removed to expose a top surface of the fifth mask layer 29 under the sixth mask patterns 31*p*. The fifth mask layer 29 and the fourth mask layer 27 may be sequentially etched using the eighth mask patterns 35 as an etch mask to expose a top surface of the third mask layer 25 and to form fourth mask patterns 27*p* and fifth mask patterns 29*p*. An adjacent pair of the fifth mask patterns 29*p*, which are respectively disposed in the second logic p-type region RP2 and the second logic n-type region RN2 and in the first memory cell MC1 and the second memory cell MC2, may be spaced apart from each other by a fourth preliminary distance DS4*a*. In an embodiment, the fourth preliminary distance DS4*a* may be two times the second width WT2.

Referring to FIGS. 7C and 7D, a ninth mask layer may be conformally formed on the third mask layer 25, and then an anisotropic etching process may be performed to expose the top surface of the third mask layer 25 and to form ninth mask patterns 37 covering side surfaces of the fourth and fifth mask patterns 27*p* and 29*p*. Each of the ninth mask patterns 37 may be formed to have the second width WT2.

Figure 8A:
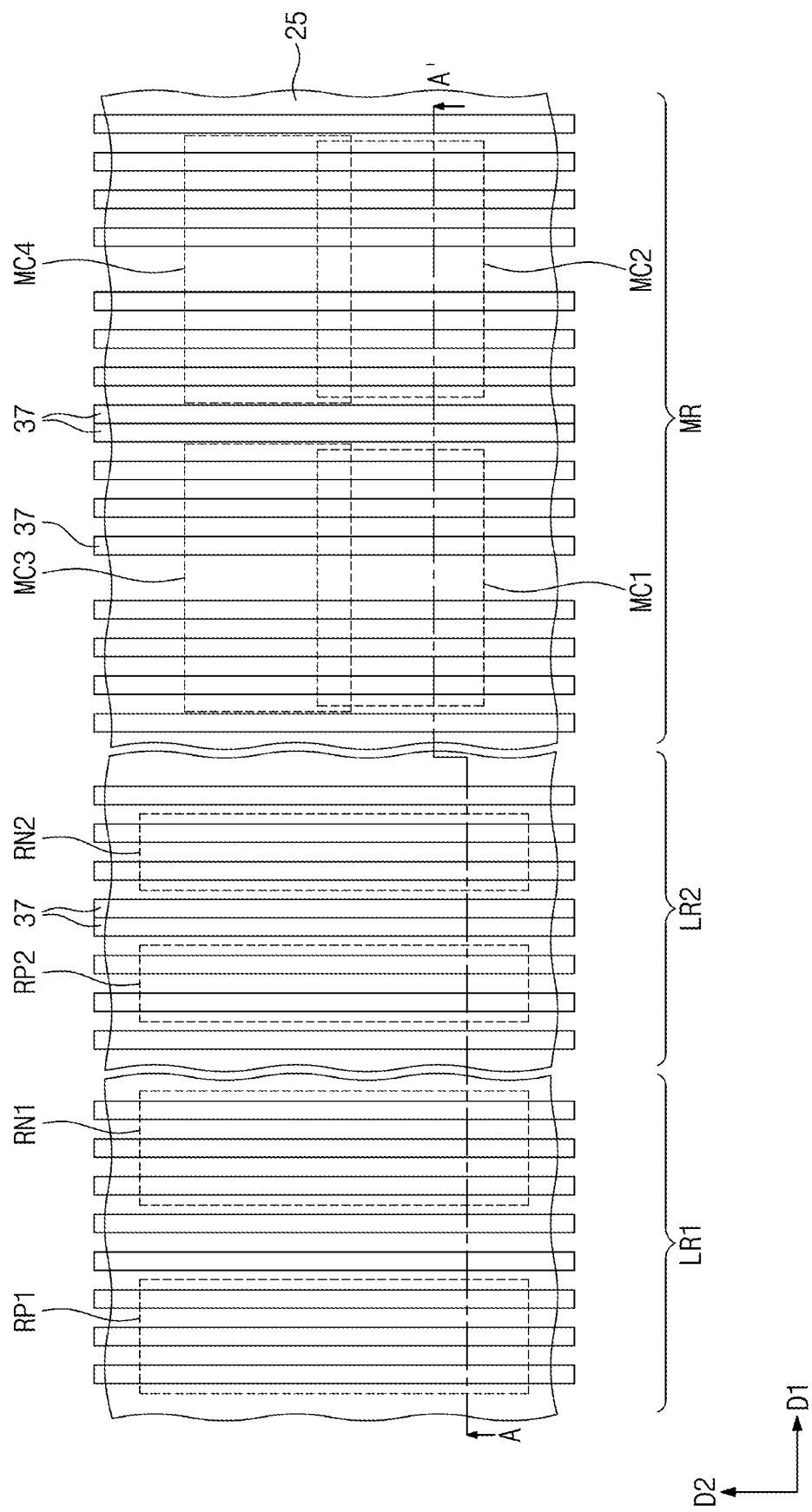

FIG. 7E illustrates a cross-sectional view taken along line A-A' of FIG. 8A.

Referring to FIGS. 7D, 7E, and 8A, an adjacent pair of the ninth mask patterns 37, which are respectively disposed in the second logic p-type region RP2 and the second logic n-type region RN2 and in the first memory cell MC1 and the second memory cell MC2, may be in contact with each other. The ninth mask patterns 37 may be line-shaped patterns extending in the second direction D2. The fifth mask patterns 29*p* and the fourth mask patterns 27*p* may be sequentially removed to expose a top surface of the third mask layer 25 under the fourth mask patterns 27*p*.

Figure 8B:
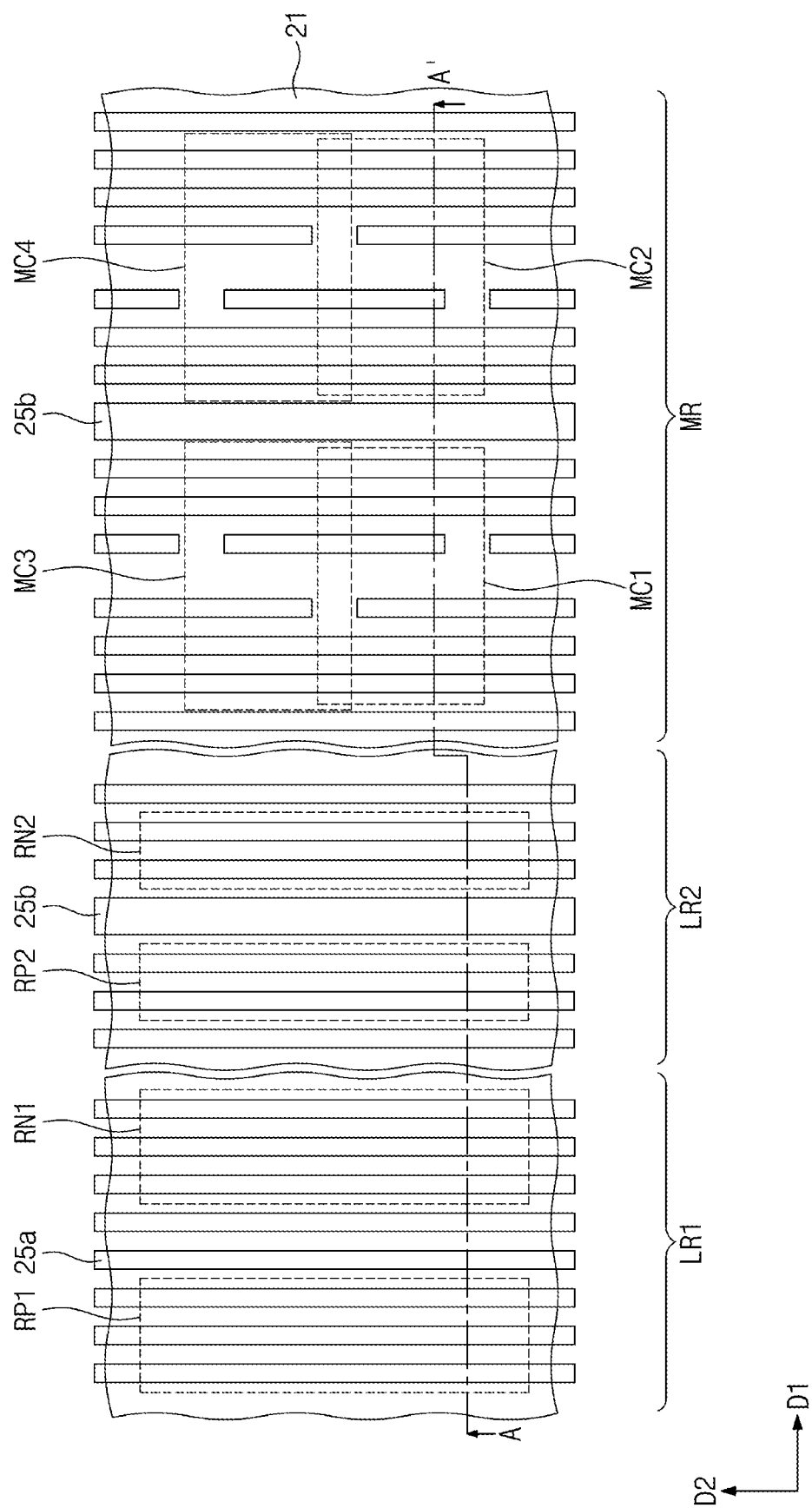

FIG. 7F illustrates a cross-sectional view taken along line A-A' of FIG. 8B.

Referring to FIGS. 7E, 7F, 8A, and 8B, third mask patterns 25*a* and 25*b* may be formed by etching the third mask layer 25 using the ninth mask patterns 37 as an etch mask. Here, the third mask patterns 25*a* and 25*b* may include third normal mask patterns 25*a* and third merged mask patterns 25*b*. Each of the third normal mask patterns 25*a* may be formed to have the second width WT2. Each of the third merged mask patterns 25*b* may be formed by etching the third mask layer 25 using a pair of the ninth mask patterns 37, which are disposed between the second logic p-type region RP2 and the second logic n-type region RN2 and between the first memory cell MC1 and the second memory cell MC2 and are in contact with each other. Thus, the third merged mask patterns 25*b* may have a third width WT3, which is larger than the second width WT2. In an embodiment, the third width WT3 may be about two times the second width WT2.

Referring to FIGS. 8A and 8B, the bar-shaped fins (e.g., the second, third, sixth, and seventh memory fins F(M2), F(M3), F(M6), and F(M7)) of FIG. 1 may be formed in the memory region MR by removing portions of the third normal mask patterns 25*a*, which correspond to gap regions, in the second direction D2, between the second, third, sixth, and seventh memory fins F(M2), F(M3), F(M6), and F(M7) of FIG. 1. Thereafter, the second mask layer 23 may be etched using the third mask patterns 25*a* and 25*b* as an etch mask to form second mask patterns 23*a* and 23*b* and to expose a top surface of the first mask layer 21. The second mask patterns 23*a* and 23*b* may include second normal mask patterns 23*a* of the second width WT2 and second merged mask patterns 23*b* of the third width WT3.

Due to a loading effect caused by the difference in width between the third mask patterns 25*a* and 25*b*, the third normal mask patterns 25*a* may be formed to have a first thickness TH1, and the third merged mask patterns 25*b* may be formed to have a second thickness TH2 that is larger than the first thickness TH1. If the third merged mask patterns 25*b* made of polysilicon have a large thickness, it may be difficult to remove the third merged mask patterns 25*b*, and in this case, the fins F may be formed to have a final structure causing a reliability issue in the semiconductor device.

Referring to FIGS. 7F and 7G, a tenth mask pattern 41 may be formed to cover the first logic region LR1 and the second logic region LR2 and to expose the memory region MR. The first mask layer 21 may be etched using the third mask patterns 25*a* and 25*b* as an etch mask, and as a result, first mask patterns 21*a* and 21*b* may be formed in the memory region MR to expose the top surface of the substrate 1. The first mask patterns 21*a* and 21*b* may include first normal mask patterns 21*a* of the second width WT2 and first merged mask patterns 21*b* of the third width WT3.

Figure 8C:
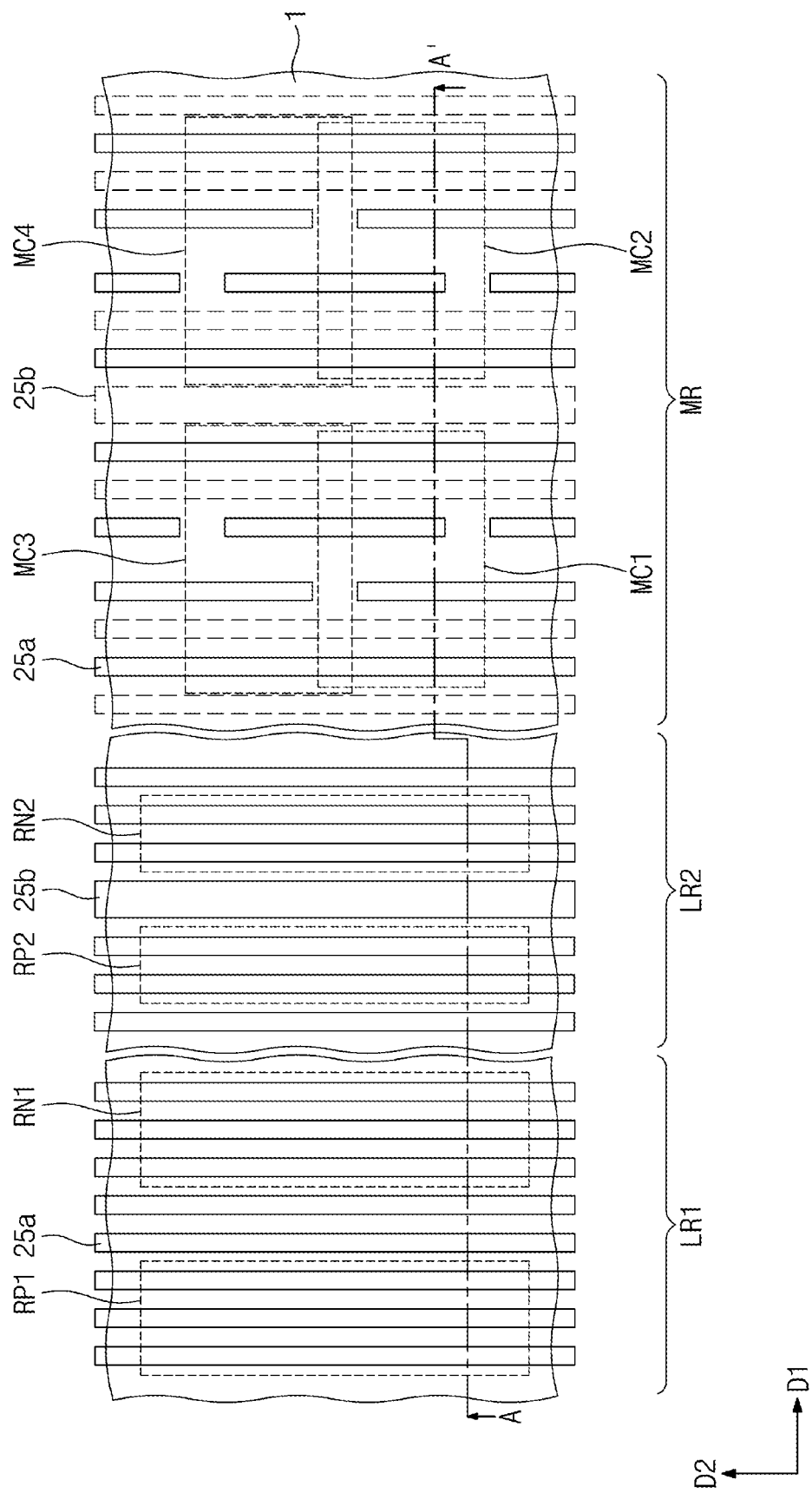

FIGS. 7H and 7I illustrate cross-sectional views taken along line A-A' of FIG. 8C.

Referring to FIGS. 8C and 7H, the tenth mask pattern 41 may be removed. Thereafter, an eleventh mask pattern 43 may be formed to cover the first logic region LR1 and the second logic region LR2 and to have first and second openings OP1 and OP2, which partially expose the memory region MR. The first openings OP1 may be formed to expose the first, third, and sixth ones of the third normal mask patterns 25*a* in the first memory cell MC1 and to expose the second, fifth, and seventh ones of the third normal mask patterns 25a in the second memory cell MC2, when counted in the first direction D1. The second opening OP2 may be formed to expose the third merged mask pattern 25b, which is located between the first memory cell MC1 and the second memory cell MC2. Each of the first openings OP1 may have a fourth width WT4. The second opening OP2 may have a fifth width WT5, which is larger than the fourth width WT4.

Referring to FIGS. 8C, 7H, and 7I, the third normal mask patterns 25a exposed through the first openings OP1 and the third merged mask pattern 25b exposed through the second opening OP2 may be removed by supplying an etchant ET, as depicted by the dotted arrows of FIG. 7H. In an embodiment, the etchant ET may include hydrogen bromide (HBr). When compared with carbon-fluorine compounds, e.g., $C_4F_8$, $CH_3F$, and $CHF_3$, the hydrogen bromide exhibits an excellent property in terms of etch selectivity of polysilicon with respect to silicon oxide (e.g., LPTEOS). Thus, it may be possible to prevent the second mask patterns 23a and 23b under the third mask patterns 25a and 25b from being damaged, during the removal of the third mask patterns 25a and 25b, which are formed of polysilicon and have different thicknesses from each other.

The second mask patterns 23a and 23b and the first mask patterns 21a and 21b, which are exposed through the first and second openings OP1 and OP2, may be etched to expose the top surface of the substrate 1, after the removal of the third mask patterns 25a and 25b. Here, the etching process may be performed in an over-etching manner, and in this case, first and second recess regions RCa and RCb may be formed on portions of the top surface of the substrate 1, which are respectively exposed through the first and second openings OP1 and OP2. The first openings OP1 may have a relatively small width WT4, and in this case, the top surface of the substrate 1 below the first openings OP1 may be less etched, e.g., as compared to the top surface of the substrate 1 below the second openings OP2, due to a difficulty in supplying the etchant. By contrast, the second opening OP2 may have a relatively large width WT5, and in this case, the etchant may be more easily supplied to the top surface of the substrate 1 through the second opening OP2. Accordingly, the top surface of the substrate 1 may be more deeply etched through the second opening OP2. As a result, the first recess region RCa may have a first recess depth DTa, and the second recess region RCb may have a second recess depth DTb, which is larger, e.g., deeper, than the first recess depth DTa.

Referring to FIGS. 7I and 7J, the eleventh mask pattern 43 may be removed. Thereafter, a twelfth mask pattern 45 may be formed to cover the first and second logic regions LR1 and LR2, and to expose the memory region MR. The substrate 1 may be etched using the third normal mask patterns 25a as an etch mask, and as a result, the first to eighth memory fins F(M1) to F(M8) and third to fifth trenches TR3 to TR5 therebetween may be formed in the memory region MR. Here, in the memory region MR, the etching process may be performed to remove the third normal mask patterns 25a and the second normal mask patterns 23a, and to leave the first normal mask patterns 21a. The third trench TR3 between the second and third memory fins F(M2) and F(M3) may be formed to have a third trench depth DT3a. A fourth trench TR4 between the first and second memory fins F(M1) and F(M2) may be formed to have a fourth trench depth DT4a. The fourth trench depth DT4a may be deeper than the third trench depth DT3a by the first recess depth DTa. The fifth trench TR5 between the fourth and fifth memory fins F(M4) and F(M5) may be formed to have a fifth trench depth DT5a. The fifth trench depth DT5a may be deeper than the fourth trench depth DT4a by the second recess depth DTb. A lower portion of an inner surface of the fifth trench TR5 may have a crooked, e.g., uneven, shape, as a result of transcription of the profile of the second recess region RCb. For example, due to the larger depth and width of the second recess region RCb, e.g., as compared to the first recess region RCa, the fifth trench depth DT5a may be formed with inflection points IFP, e.g., concavities, at its lower portions.

Referring to FIGS. 7J and 7K, the twelfth mask pattern 45 may be removed. Thereafter, a thirteenth mask pattern 47 may be formed to cover the memory region MR and to expose the first and second logic regions LR1 and LR2. Here, between the second logic p-type region RP2 and the second logic n-type region RN2, the third merged mask pattern 25b, which has a relatively large width WT3 and a relatively large thickness TH2, may be exposed to the outside. Since, as described above, the third merged mask pattern 25b has a relatively large thickness, the third merged mask pattern 25b may have a difficulty in removing them and may cause an undesired (e.g., thin) profile of the fins F, after a subsequent etching process.

Referring to FIGS. 7K and 7L, hydrogen bromide (HBr) may be supplied to remove the third mask patterns 25a and 25b, and to expose the second mask patterns 23a and 23b. Here, since the hydrogen bromide (HBr) has an excellent property in terms of etch selectivity of polysilicon with respect to silicon oxide, the second mask patterns 23a and 23b may be hardly etched during the removal of the third mask patterns 25a and 25b of different thicknesses.

Referring to FIG. 7M, a fourteenth mask layer 51 may be conformally formed on the first mask layer 21. In an embodiment, the fourteenth mask layer 51 may be a silicon oxide layer that is formed by an atomic layer deposition (ALD) method. By forming the fourteenth mask layer 51, it may be possible to increase effective widths of the second mask patterns 23a and 23b in the logic regions LR1 and LR2.

Referring to FIGS. 7M and 7N, an anisotropic etching process may be performed to etch the first mask layer 21 and a portion of the substrate 1 in the logic regions LR1 and LR2, and as a result, the first mask patterns 21a and 21b and the fins F may be formed in the logic regions LR1 and LR2. In the first logic region LR1, first trenches TR1 may be formed between the fins F. In the second logic region LR2, second trenches TR2 may be formed between the fins F. The first and second trenches TR1 and TR2 may be formed to have the same depth (hereinafter, a first trench depth DT1a). The first trench depth DT1a may be smaller than the third trench depth DT3a of FIG. 7J.

FIGS. 7O and 7P illustrate cross-sectional views taken along line A-A' of FIG. 8D.

Referring to FIGS. 7N, 7O, and 8D, the second mask patterns 23a and 23b may be removed from the logic regions LR1 and LR2. The thirteenth mask pattern 47 may be removed from the memory region MR. Thereafter, a first insulating gapfill layer may be formed on the substrate 1 to fill the first to fifth trenches TR1 to TR5, and then a chemical mechanical polishing (CMP) process may be performed on the first insulating gapfill layer to form shallow device isolation layers 3 in the first to fifth trenches TR1 to TR5. During the CMP process, the first mask patterns 21a and 21b may be used as a CMP stop layer. A fifteenth mask pattern 55 having third and fourth openings OP3 and OP4 may be formed on the first mask patterns 21a and 21b. The third opening OP3 may be formed to expose the first normal mask patterns 21a, which are located between the first logic p-type region RP1 and the first logic n-type region RN1. The fourth opening OP4 may be formed to expose the first merged mask patterns 21b, which are located between the second logic p-type region RP2 and the second logic n-type region RN2.

Referring to FIGS. 7O, 7P, and 8D, deep trenches DTR may be formed by an anisotropic etching process, which is performed to remove some of the first mask patterns 21a and 21b (e.g., depicted by wide dotted lines in FIG. 8D) and the shallow device isolation layers 3, which are exposed through the third and fourth openings OP3 and OP4, and portions of the substrate 1 thereunder, and in an embodiment, the fifteenth mask pattern 55 may be used as an etch mask in the anisotropic etching process. The deep trenches DTR may be formed to have a second trench depth DT2a. The second trench depth DT2a may be larger than the fifth trench depth DT5a of FIG. 7J.

Referring to FIGS. 7P and 7Q, the fifteenth mask pattern 55 may be removed. Next, a second insulating gapfill layer may be formed on the substrate 1 to fill the deep trenches DTR, and a CMP process may be performed on the second insulating gapfill layer to form the deep device isolation layer 5. During the CMP process, the first normal mask patterns 21a may be used as a CMP stop layer.

Figure 8E:
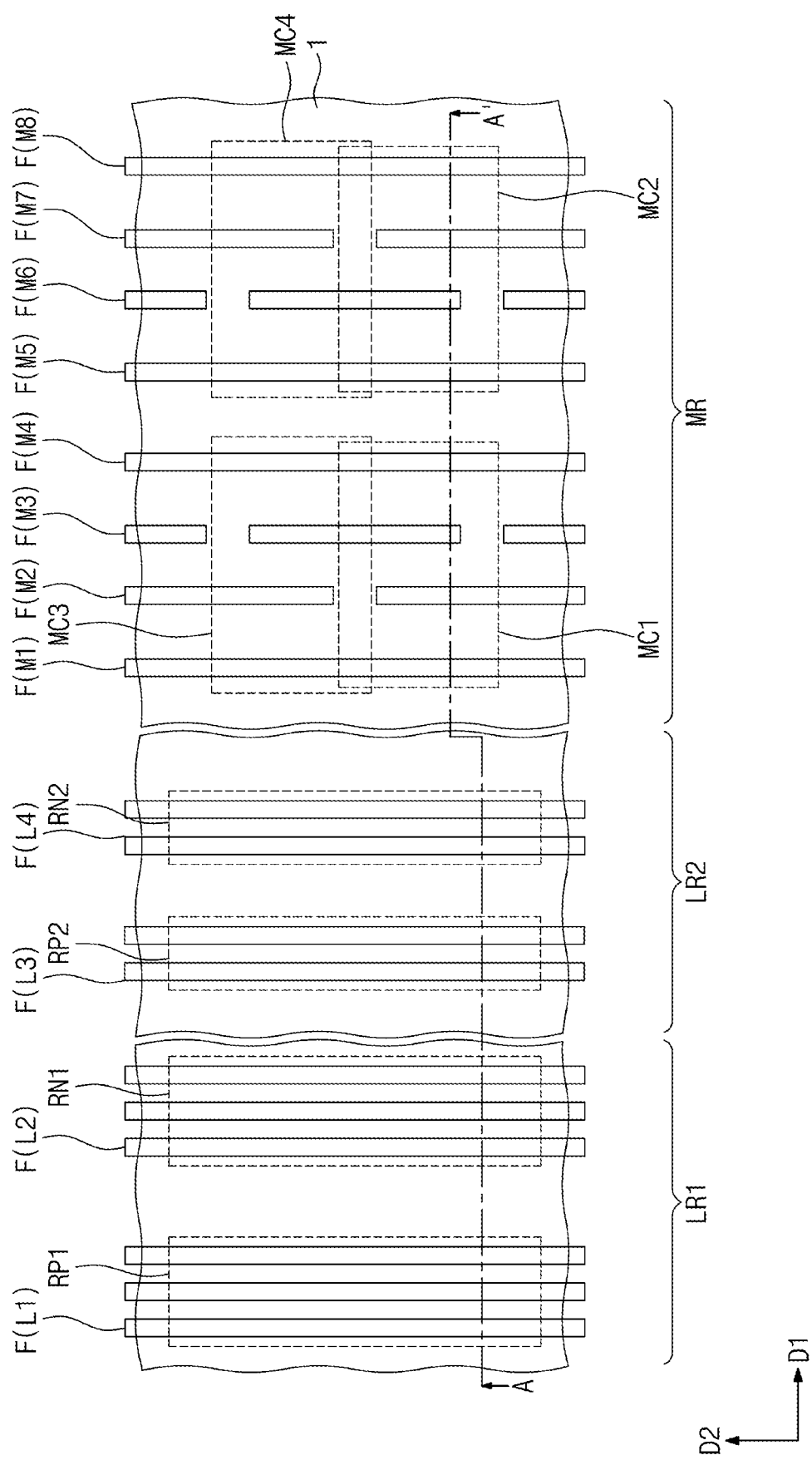

FIG. 7R illustrates a cross-sectional view taken along line A-A' of FIG. 8E.

Referring to FIGS. 7Q, 7R, and 8E, an etch-back process may be performed to partially remove the shallow device isolation layers 3 and a portion of the deep device isolation layer 5, and as a result, upper side surfaces of the fins F may be exposed. The distances between the fins F and the depths of the shallow and deep device isolation layers 3 and 5 may be substantially the same as those described with reference to FIG. 2. Thereafter, the gate insulating layers GO, the gate electrodes G, the gate spacer GS, and the source/drain patterns (e.g., SD1 to SD6) may be formed through the process described with reference to FIGS. 1 to 6C.

In a method of fabricating a semiconductor device according to embodiments, a merged mask pattern may be formed to reduce a distance between regions (e.g., a distance between the memory cells MC1 and MC2 and a distance between the second logic p- and n-type regions RP2 and RN2). Accordingly, it may be possible to realize a highly-integrated semiconductor device. Furthermore, by using hydrogen bromide (HBr), it may be possible to reduce a process failure in a fabrication process and to improve reliability of a semiconductor device.

Figure 9:
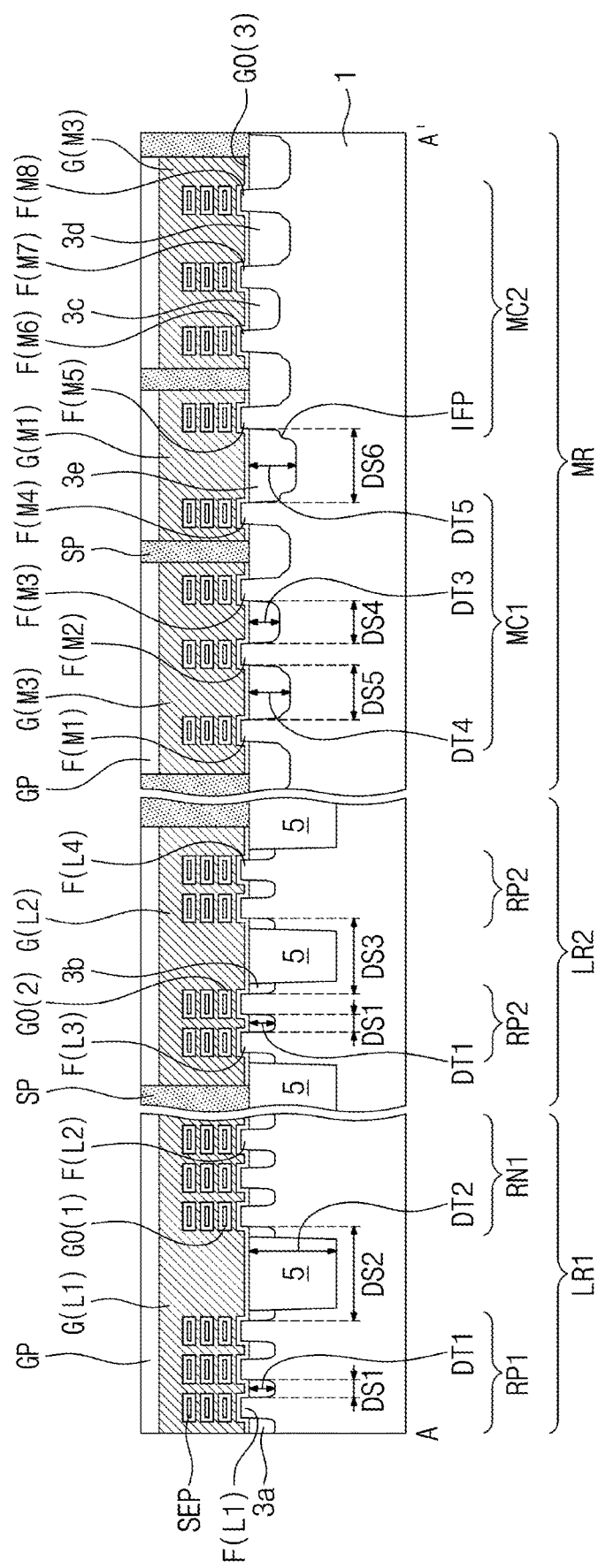
FIG. 9 is a cross-sectional view along line A-A' of FIG. 1.
Figure 10:
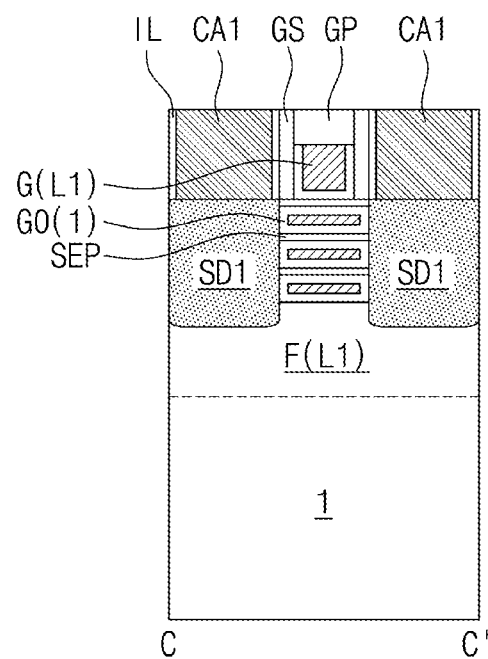
FIG. 10 is a cross-sectional view along line C-C' of FIG. 1.

FIG. 9 is a cross-sectional view taken along line A-A' of FIG. 1. FIG. 10 is a cross-sectional view taken along line C-C' of FIG. 1.

Referring to FIGS. 9 and 10, multi-bridge channel field-effect transistors (MBCFETs) may be disposed on the substrate 1. In the present embodiment, a plurality of semiconductor patterns SEP may be stacked on the fins F. The fins F and the semiconductor patterns SEP may be spaced apart from each other. The gate insulating layer GO may be provided to surround the semiconductor patterns SEP. A portion of the gate electrode G may be interposed between the fins F and the semiconductor patterns SEP and between the semiconductor patterns SEP. Except for the afore-described features, the semiconductor device in the present embodiment may be substantially the same as or similar to those described with reference to FIGS. 1A to 6C.

By way of summation and review, embodiments provide a semiconductor device with improved electric characteristics and high integration density. Embodiments provide a method of fabricating a semiconductor device with a high yield.

That is, in a semiconductor device and its fabrication method according to embodiments, a merged mask pattern may be used to reduce a distance between regions. Accordingly, it may be possible to realize a highly-integrated semiconductor device.

In addition, mask patterns of different thicknesses may be removed using hydrogen bromide (HBr). As such, it may be possible to reduce a process failure, increase a production yield, and improve reliability of a semiconductor device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a substrate including a first memory cell and a second memory cell, the first memory cell and the second memory cell being adjacent to each other in a first direction;
   a first memory fin, a second memory fin, a third memory fin, and a fourth memory fin protruding from the substrate and adjacent to each other in the first direction in the first memory cell;
   a fifth memory fin, a sixth memory fin, a seventh memory fin, and an eighth memory fin protruding from the substrate and adjacent to each other in the first direction in the second memory cell; and
   a first shallow device isolation layer between the fourth memory fin and the fifth memory fin, the first shallow device isolation layer having a first depth, a first sidewall extending from the fourth memory fin and having a curved shape with a first inflection point and a second sidewall extending from the fifth memory fin and having a curved shape with a second inflection point.

2. The semiconductor device as claimed in claim 1, wherein a first distance between the first memory fin and the second memory fin is larger than a second distance between the second memory fin and the third memory fin, and is smaller than a third distance between the fourth memory fin and the fifth memory fin.

3. The semiconductor device as claimed in claim 2, further comprising:
   a second shallow device isolation layer between the first memory fin and the second memory fin, the second shallow device isolation layer having a second depth; and
   a third shallow device isolation layer between the second memory fin and the third memory fin, the third shallow device isolation layer having a third depth, the second depth being smaller than the first depth and larger than the third depth.

4. The semiconductor device as claimed in claim 1, further comprising first logic fins in a first logic p-type region of the substrate, a first distance between adjacent ones of the first logic fins being smaller than a second distance between the second and third memory fins.

5. The semiconductor device as claimed in claim 4, further comprising second shallow device isolation layers between adjacent ones of the first logic fins, a second depth of the second shallow device isolation layers being smaller than the first depth of the first shallow device isolation layer.

6. The semiconductor device as claimed in claim 4, wherein the substrate further includes a first logic n-type region adjacent to the first logic p-type region, the semiconductor device further comprises second logic fins doped with p-type impurities in the first logic n-type region of the substrate, the second logic fins protruding from the substrate and being spaced apart from each other by the first distance, and the first logic fins being doped with p-type impurities.

7. The semiconductor device as claimed in claim 6, wherein, a third distance between a closest one of the first logic fins to the first logic n-type region and a closest one of the second logic fins to the first logic p-type region is larger than a fourth distance between the fourth memory fin and the fifth memory fin.

8. The semiconductor device as claimed in claim 7, further comprising:
  third logic fins in a second logic p-type region of the substrate, the third logic fins protruding from the substrate and being spaced apart from each other by the first distance; and
  fourth logic fins in a second logic n-type region of the substrate, the second logic p-type region being adjacent to the second logic n-type region, and the fourth logic fins protruding from the substrate and being spaced apart from each other by the first distance.

9. The semiconductor device as claimed in claim 8, wherein:
  a number of the third logic fins is smaller than a number of the first logic fins, and
  a fifth distance between a closest one of the third logic fins to the second logic n-type region and a closest one of the fourth logic fins to the second logic p-type region is smaller than the third distance.

10. The semiconductor device as claimed in claim 7, further comprising a deep device isolation layer in the substrate, the deep device isolation layer being between the first logic n-type region and the first logic p-type region, the deep device isolation layer having a second depth deeper than the first depth of the first shallow device isolation layer.

11. The semiconductor device as claimed in claim 1, wherein:
  the first memory fin, the fourth memory fin, the fifth memory fin, and the eighth memory fin are doped with impurities of a first conductivity type, and
  the second memory fin, the third memory fin, the sixth memory fin, and the seventh memory fin are doped with impurities of a second conductivity type different from the first conductivity type.

12. A semiconductor device, comprising:
  a substrate including a first memory cell and a second memory cell, the first memory cell and the second memory cell being adjacent to each other in a first direction; a first memory fin, a second memory fin adjacent to the first memory fin, a third memory fin adjacent to the second memory fin, and a fourth memory fin adjacent to the third memory fin, each protruding from the substrate and adjacent in the first direction in the first memory cell;
  a fifth memory fin, a sixth memory fin adjacent to the fifth memory fin, a seventh memory fin adjacent to the sixth memory fin, and an eighth memory fin adjacent to the seventh memory fin, each protruding from the substrate and adjacent in the first direction in the second memory cell, wherein a first distance between the first memory fin and the second memory fin is larger than a second distance between the second memory fin and the third memory fin and is smaller than a third distance between the fourth memory fin and the fifth memory fin; and
  a first shallow device isolation layer between the fourth memory fin and the fifth memory fin, a first sidewall of the first shallow device isolation layer extending from the fourth memory fin and a second sidewall of the first shallow device isolation layer extending from the fifth memory fin and opposing the first sidewall, each of the first sidewall and the second sidewall having a curved shape with an inflection point.

13. The semiconductor device as claimed in claim 12, further comprising:
  a second shallow device isolation layer between the first memory fin and the second memory fin; and
  a third shallow device isolation layer between the second memory fin and the third memory fin,
  wherein a second depth of the second shallow device isolation layer is shallower than a first depth of the first shallow device isolation layer and is deeper than a third depth of the third shallow device isolation layer.

14. The semiconductor device as claimed in claim 12, further comprising:
  first logic fins in a first logic p-type region of the substrate, the first logic fins protruding from the substrate;
  second logic fins in a first logic n-type region of the substrate, the first logic n-type region being adjacent to the first logic p-type region, the second logic fins protruding from the substrate; and
  a first gate electrode crossing the first logic fins and the second logic fins, wherein a fourth distance between a closest one of the first logic fins to the first logic n-type region and a closest one of the second logic fins to the first logic p-type region is larger than the third distance.

15. The semiconductor device as claimed in claim 14, further comprising:
  third logic fins in a second logic p-type region of the substrate, the third logic fins protruding from the substrate, and a number of the third logic fins being smaller than a number of the first logic fins; and
  fourth logic fins in a second logic n-type region of the substrate adjacent to the second logic p-type region, the fourth logic fins protruding from the substrate, and a fifth distance between a closest one of the third logic fins to the second logic n-type region and a closest one of the fourth logic fins to the second logic p-type region is smaller than the fourth distance.

16. A semiconductor device, comprising:
  a substrate including a first memory cell and a second memory cell, the first memory cell and the second memory cell being adjacent to each other in a first direction;
  a first memory fin, a second memory fin adjacent to the first memory fin, a third memory fin adjacent to the second memory fin, and a fourth memory fin adjacent to the third memory fin, each protruding from the substrate and adjacent in the first direction in the first memory cell;
  a fifth memory fin, a sixth memory fin adjacent to the fifth memory fin, a seventh memory fin adjacent to the sixth memory fin, and an eighth memory fin adjacent to the seventh memory fin, each protruding from the substrate and adjacent in the first direction in the second memory cell;

a first gate electrode crossing the first memory fin, the second memory fin, and the third memory fin;

a second gate electrode crossing the fourth memory fin and the fifth memory fins;

a third gate electrode crossing the sixth memory fin, the seventh memory fin, and the eighth memory fin, wherein a first distance between the first memory fin and the second memory fin is larger than a second distance between the second memory fin and the third memory fin and is smaller than a third distance between the fourth memory fin and the fifth memory fin; and a shallow device isolation layer between the fourth memory fin and the fifth memory fin, a first sidewall of the shallow device isolation layer extending from the fourth memory fin and a second sidewall of the shallow device isolation layer extending from the fifth memory fin and opposing the first sidewall, each of the first sidewall and the second sidewall having a curved shape with an inflection point.

17. The semiconductor device as claimed in claim 16, wherein:

the first memory fin, the fourth memory fin, the fifth memory fin, and the eighth memory fin are doped with impurities of a first conductivity type, and the second memory fin, the third memory fin, the sixth memory fin, and the seventh memory fin are doped with impurities of a second conductivity type different from the first conductivity type.

18. The semiconductor device as claimed in claim 16, further comprising:

a first shallow device isolation layer between the first memory fin and the second memory fin, the first shallow device isolation layer having a first depth; and a second shallow device isolation layer between the second memory fin and the third memory fin, the second shallow device isolation layer having a second depth, wherein the shallow device isolation layer is a third shallow device isolation layer between the fourth memory fin and the fifth memory fin, the third shallow device isolation layer having a third depth, the first depth being greater than the second depth and smaller than the third depth.

* * * * *